(12) United States Patent
Hold

(10) Patent No.: US 8,319,294 B2
(45) Date of Patent: Nov. 27, 2012

(54) TECHNIQUES FOR PROVIDING A SOURCE LINE PLANE

(75) Inventor: Betina Hold, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 316 days.

(21) Appl. No.: 12/695,964

(22) Filed: Jan. 28, 2010

(65) Prior Publication Data

US 2010/0210075 A1   Aug. 19, 2010

Related U.S. Application Data

(60) Provisional application No. 61/153,437, filed on Feb. 18, 2009.

(51) Int. Cl.
*H01L 27/088* (2006.01)

(52) U.S. Cl. ............ 257/401; 257/57; 257/66; 257/368; 438/197

(58) Field of Classification Search .................. None
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |

(Continued)

FOREIGN PATENT DOCUMENTS

CA    272437    7/1927

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Evan Pert
*Assistant Examiner* — Scott R Wilson
(74) *Attorney, Agent, or Firm* — Wilmer Cutler Pickering Hale and Dorr LLP

(57) ABSTRACT

Techniques for providing a source line plane are disclosed. In one particular exemplary embodiment, the techniques may be realized as an apparatus for providing a source line plane. The apparatus may comprise a source line plane coupled to at least one constant voltage source. The apparatus may also comprise a plurality of memory cells arranged in an array of rows and columns, each memory cell including one or more memory transistors. Each of the one or more memory transistors may comprise a first region coupled to the source line plane, a second region coupled to a bit line, a body region disposed between the first region and the second region, wherein the body region may be electrically floating, and a gate coupled to a word line and spaced apart from, and capacitively coupled to, the body region.

25 Claims, 13 Drawing Sheets

U.S. PATENT DOCUMENTS

| | | |
|---|---|---|
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |

| | | |
|---|---|---|
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1* | 3/2005 | Fazan et al. .................. 365/177 |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |

| | | |
|---|---|---|
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al.,—Capacitorless 1t DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. on El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless It DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilising a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, an 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMÓ Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping-Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562λm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, an 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. on El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15λm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner

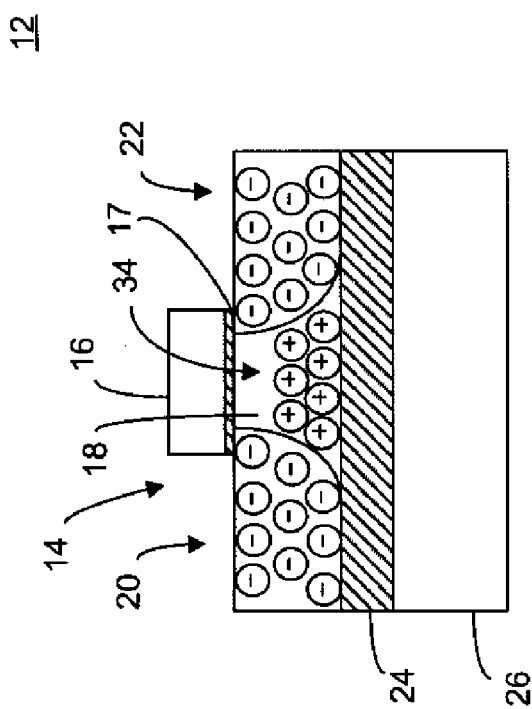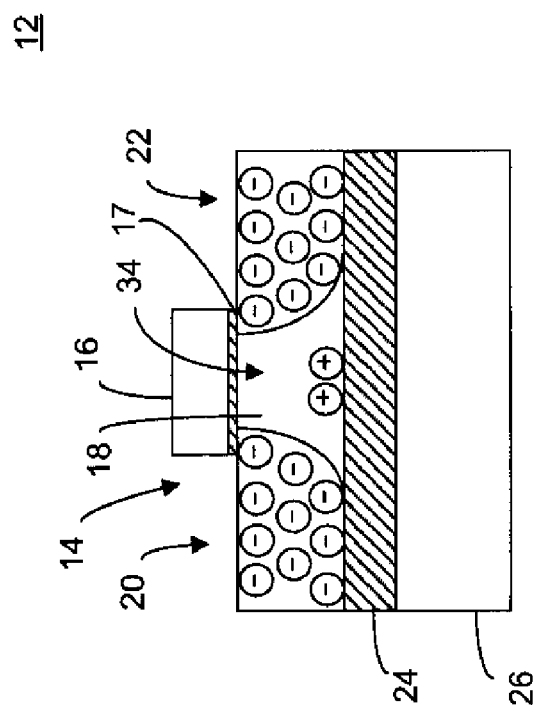

TECHNIQUES FOR PROVIDING A SOURCE LINE PLANE

CROSS-REFERENCE TO RELATED APPLICATIONS

This patent application claims priority to U.S. Provisional Patent Application No. 61/153,437, filed Feb. 18, 2009, which is hereby incorporated by reference herein in its entirety.

FIELD OF THE DISCLOSURE

The present disclosure relates generally to semiconductor memory devices and, more particularly, to techniques for providing a source line (SL) plane in a semiconductor memory device.

BACKGROUND OF THE DISCLOSURE

There is a continuing trend to employ and/or fabricate advanced integrated circuits using techniques, materials, and devices that improve performance, reduce circuit area, reduce leakage current, and enhance overall scaling. Semiconductor-on-insulator (SOI) is a material which may be used to fabricate such integrated circuits. Integrated circuits fabricated with such a material are known as SOI devices and may include, for example, partially depleted (PD) devices, fully depleted (FD) devices, multiple gate devices (for example, double or triple gate), and Fin-FET devices.

One example of an SOI device is a semiconductor memory device. Such a semiconductor memory device may include an electrically floating body in which electrical charges may be stored. The electrical charges stored in the electrically floating body may represent a logic high or binary "1" data state or a logic low or binary "0" data state.

Various techniques may be employed to read data from and/or write data to a semiconductor memory device having an electrically floating body. In one conventional technique, a semiconductor memory device having a memory cell with a memory transistor may be read by applying a bias to a drain region of the memory transistor, as well as a bias to a gate of the memory transistor that is above a threshold voltage of the memory transistor. As such, conventional reading techniques may sense an amount of channel current provided/generated in response to the application of the bias to the gate of the memory transistor to determine a state of the memory cell. For example, an electrically floating body region of the memory cell may have two or more different current conditions/states corresponding to two or more different logical states (e.g., two different current conditions/states corresponding to two different logic states: binary "0" data state and binary "1" data state).

Also, conventional writing techniques for semiconductor memory devices having memory cells with N-Channel type memory transistors typically result in an excess of majority charge carriers in electrically floating body regions of the memory transistors by channel impact ionization or by band-to-band tunneling (gate-induced drain leakage "GIDL"). The majority charge carriers may be removed via drain side hole removal, source side hole removal, or drain and source hole removal, for example, using back gate pulsing.

Often, conventional reading and writing techniques may utilize a large number of voltage drivers (for example, a voltage driver per source line (SL)) which may occupy a large amount of area on a circuit board or die. Also, pulsing between positive and negative gate biases during read and write operations may reduce a net quantity of charge carriers in an electrically floating body region of a memory transistor in a semiconductor memory device, which, in turn, may gradually reduce, or even eliminate, a net charge representing data stored in the memory transistor. In the event that a negative voltage is applied to a gate of a memory transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and a net charge associated with majority charge carriers located in the electrically floating body region may decrease over time. This phenomenon may be characterized as charge pumping, which may be problematic because the net quantity of charge carriers may be reduced in the memory transistor, which, in turn, may gradually reduce, or even eliminate, a net charge representing data stored in the memory transistor.

In view of the foregoing, it may be understood that there may be significant problems and shortcomings associated with reading from and/or writing to electrically floating body semiconductor memory devices using conventional reading/writing techniques.

SUMMARY OF THE DISCLOSURE

Techniques for providing a source line (SL) plane are disclosed. In one particular exemplary embodiment, the techniques may be realized as an apparatus for providing a source line plane. The apparatus may comprise a source line plane coupled to at least one constant voltage source. The apparatus may also comprise a plurality of memory cells arranged in an array of rows and columns, each memory cell including one or more memory transistors. Each of the one or more memory transistors may comprise a first region coupled to the source line plane, a second region coupled to a bit line, a body region disposed between the first region and the second region, wherein the body region may be electrically floating, and a gate coupled to a word line and spaced apart from, and capacitively coupled to, the body region.

In accordance with other aspects of this particular exemplary embodiment, the at least one constant voltage source may provide at least one connection to ground.

In accordance with yet another aspect of this particular exemplary embodiment, the at least one constant voltage source may provide at least one internal ground connection associated with the plurality of memory cells.

In accordance with still another aspect of this particular exemplary embodiment, the at least one constant voltage source may provide at least one external ground connection coupled to the plurality of memory cells.

In accordance with further aspects of this particular exemplary embodiment, the at least one constant voltage source may provide a connection to at least one voltage potential.

In accordance with other aspects of this particular exemplary embodiment, the at least one constant voltage source may provide at least one internal voltage potential associated with the plurality of memory cells.

In accordance with further aspects of this particular exemplary embodiment, the at least one constant voltage source may provide at least one external voltage potential coupled to the plurality of memory cells.

In accordance with additional aspects of this particular exemplary embodiment, the source line plane may comprise a plurality of source lines coupled to the plurality of memory cells.

In accordance with yet another aspect of this particular exemplary embodiment, the first region may be coupled to the source line plane via a source line.

In accordance with additional aspects of this particular exemplary embodiment, the plurality of memory cells may be arranged in a plurality of sub-arrays of rows and columns.

In accordance with other aspects of this particular exemplary embodiment, the source line plane may be associated with each of the plurality of sub-arrays of memory cells.

In accordance with further aspects of this particular exemplary embodiment, the source line plane may be a comprehensive source line plane based at least in part on its association with the each of the plurality of sub-arrays of memory cells.

In accordance with other aspects of this particular exemplary embodiment, the comprehensive source line plane may be coupled to the at least one constant voltage source.

In accordance with further aspects of this particular exemplary embodiment, the source line plane may be at least one of a source line grid and a source line plate.

In accordance with additional aspects of this particular exemplary embodiment, the source line plane may include a plurality of sub-layers of at least one of a source line grid and a source line plate.

In another particular exemplary embodiment, the techniques may be realized as a method for providing a source line plane. The method may comprise coupling a source line plane to at least one constant voltage source. The method may also comprise arranging a plurality of memory cells in an array of rows and columns, each memory cell including one or more memory transistors. Each of the one or more memory transistors may comprise a first region coupled to the source line plane, a second region coupled to a bit line, a body region disposed between the first region and the second region, wherein the body region is electrically floating, and a gate coupled to a word line and spaced apart from, and capacitively coupled to, the body region.

In accordance with other aspects of this particular exemplary embodiment, the at least one constant voltage source may provide at least one connection to ground.

In accordance with further aspects of this particular exemplary embodiment, the at least one constant voltage source may provide a connection to at least one voltage potential.

In accordance with additional aspects of this particular exemplary embodiment, the source line plane may comprise a plurality of source lines coupled to the plurality of memory cells.

In accordance with yet another aspect of this particular exemplary embodiment, the first region may be coupled to the source line plane via a source line.

In accordance with still another aspect of this particular exemplary embodiment, the at least one constant voltage source may be at least one internal voltage source associated with the plurality of memory cells.

In accordance with further aspects of this particular exemplary embodiment, the at least one constant voltage source may be at least one external voltage source coupled to the plurality of memory cells.

In accordance with additional aspects of this particular exemplary embodiment, the plurality of memory cells may be arranged in a plurality of sub-arrays of rows and columns.

In accordance with another aspect of this particular exemplary embodiment, the source line plane may be associated with each of the plurality of sub-arrays of memory cells.

In accordance with other aspects of this particular exemplary embodiment, the source line plane may be a comprehensive source line plane based at least in part on its association with the each of the plurality of sub-arrays of memory cells.

In accordance with further aspects of this particular exemplary embodiment, the comprehensive source line plane may be coupled to the at least one constant voltage source.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 2A and 2B show charge relationships, for given data states, of a memory cell in accordance with embodiments of the present disclosure.

DETAILED DESCRIPTION OF EXEMPLARY EMBODIMENTS

There are many embodiments described and illustrated herein. In one aspect, the present disclosure is directed to a combination of reading/writing methods which comprise providing a source line (SL) plane with at least one constant voltage source. The at least one constant voltage source may provide a relatively high voltage or a relatively low voltage when reading from and/or writing to memory cells and may eliminate individual and/or grouped source line (SL) drivers.

Figure 1A:
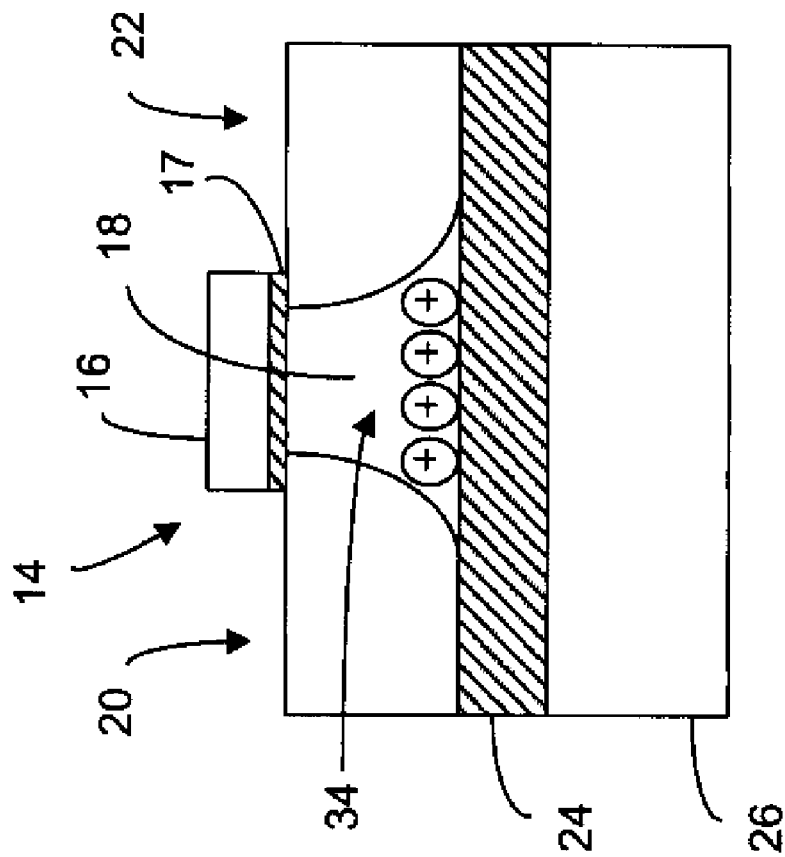
FIG. 1A shows a cross-sectional view of a memory cell in accordance with an embodiment of the present disclosure.

Referring to FIG. 1A, there is a shown a cross-sectional view of a memory cell 12 in accordance with an embodiment of the present disclosure. The memory cell 12 may comprise a memory transistor 14 (e.g., an N-channel type transistor or a P-channel type transistor) including a gate 16, an electrically floating body region 18, a source region 20, and a drain region 22. An insulating film 17 may be disposed between the gate 16 and the electrically floating body region 18. Moreover, the electrically floating body region 18 may be disposed on or above region 24, which may be an insulation region (e.g., in an SOI material/substrate) or a non-conductive region (e.g., in a bulk-type material/substrate). The insulation or non-conductive region 24 may be disposed on a substrate 26. The electrically floating body region 18 may be disposed between the source region 20 and the drain region 22. Charge carriers 34 may accumulate in or may be emitted/ejected from the electrically floating body region 18. A data state of the memory cell 12 may be defined by an amount of charge carriers 34 present in the electrically floating body region 18.

Figure 1B:
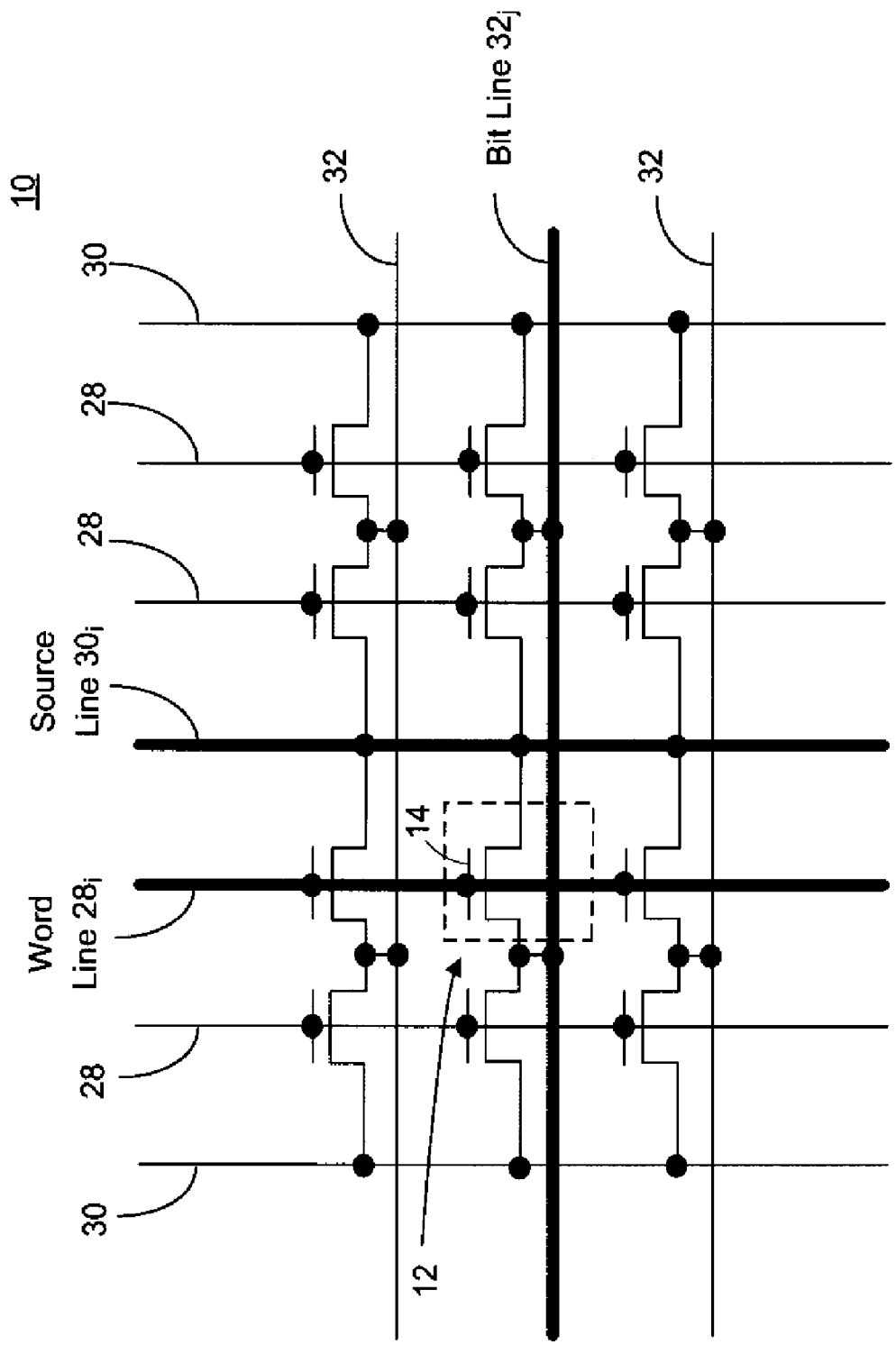
FIG. 1B shows a schematic representation of a semiconductor memory device array including a plurality of memory cells arranged in arrays of rows and columns in accordance with an embodiment of the present disclosure.

Referring to FIG. 1B, there is shown a schematic representation of a semiconductor memory device array 10 including a plurality of memory cells 12 arranged in an array of rows and columns in accordance with an embodiment of the present disclosure. The semiconductor memory device array 10 also includes a plurality of word lines 28 (WL), a plurality of source lines 30 (SL), and a plurality of bit lines 32 (BL), each electrically coupled to corresponding ones of the plurality of memory cells 12. Each memory cell 12 may include a memory transistor 14, as described above with reference to FIG. 1A, wherein the source region 20 may be coupled to an associated source line 30 (SL), the drain region 22 may be coupled to an associated bit line 32 (BL), and the gate 16 may be coupled to an associated word line 28 (WL). In an exemplary embodiment, the source region 20 of the memory transistor 14 of each memory cell 12 of a first row of memory cells 12 may be coupled (e.g., via physical diffusion and/or a source line (SL) plane) to a first source line 30 (SL). Also, the source region 20 of the memory transistor 14 of each memory cell 12 of a second row of memory cells 12 may be coupled to the first source line 30 (SL). In another exemplary embodiment, the source region 20 of the memory transistor 14 of each memory cell 12 of a second row of memory cells 12 may be coupled to a second source line 30 (SL), and the source region 20 of the memory transistor 14 of each memory cell 12 of a third row of memory cells may be coupled to a third source line 30 (SL).

Data may be written into a selected memory cell 12 of the semiconductor memory device array 10 by applying suitable control signals to a selected word line 28, a selected source line 30, and/or a selected bit line 32. The memory cell 12 may exhibit (1) a first data state which is representative of a first amount of charge carriers 34 in the electrically floating body region 18 of the memory transistor 14, and (2) a second data state which is representative of a second amount of charge carriers 34 in the electrically floating body region 18 of the memory transistor 14. Additional data states are also possible.

The semiconductor memory device array 10 may further include data write circuitry (not shown), coupled to the selected memory cell 12, to apply (i) first write control signals to the memory cell 12 to write the first data state therein and (ii) second write control signals to the memory cell 12 to write the second data state therein. In response to the first write control signals applied to the selected memory cell 12, the memory transistor 14 may generate a first transistor current which may substantially provide a first amount of charge carriers 34 present in the electrically floating body region 18 of the memory transistor 14. In this case, charge carriers 34 may accumulate in or may be emitted/ejected from the electrically floating body region 18. As discussed above, a data state may be defined by an amount of charge carriers 34 present in the electrically floating body region 18. For example, the amount of charge carriers 34 present in the electrically floating body region 18 may represent a logic high (i.e., binary "1" data state) or a logic low (i.e., binary "0" data state). Additional data states are also possible.

The first write control signals may include a signal applied to the gate 16 and a signal applied to the source region 20, wherein the signal applied to the source region 20 may include a first voltage potential having a first amplitude and a second voltage potential having a second amplitude. In another exemplary embodiment, the first write control signals may include a signal applied to the gate 16 and a signal applied to the drain region 22, wherein the signal applied to the drain region 22 may include a third voltage potential having a third amplitude and a fourth voltage potential having a fourth amplitude.

Also, the second write signals may include a signal applied to the gate 16, a signal applied to the source region 20, and a signal applied to the drain region 22. The signal applied to the drain region 22 may include a block voltage potential to prevent the first data state from being written into the memory transistor 14.

Referring to FIGS. 2A and 2B, there are shown charge relationships, for given data states, of the memory cell 12 in accordance with exemplary embodiments of the present disclosure. In exemplary embodiments, each memory cell 12 of the semiconductor memory device array 10 may operate by accumulating or emitting/ejecting majority charge carriers 34 (e.g., electrons or holes) in/from the electrically floating body region 18. FIGS. 2A and 2B illustrate this with an N-Channel memory transistor 14. More specifically, various write techniques may be employed to accumulate majority charge carriers 34 (in this example, holes) in the electrically floating body region 18 of the memory cell 12 by, for example, impact ionization near the source region 20 and/or drain region (see FIG. 2A). Also, the majority charge carriers 34 may be emitted or ejected from the electrically floating body region 18 by, for example, forward biasing a junction between the source region 20 and the electrically floating body region 18 and/or a junction between the drain region 22 and the electrically floating body region 18 (see FIG. 2B).

As shown in FIG. 2A, a logic high (binary "1" data state) may correspond to an increased concentration of majority charge carriers 34 (e.g., holes) in the electrically floating body region 18 relative to an unwritten memory cell 12 and/or a memory cell 12 that is written with a logic low (binary "0"

data state). In contrast, as shown in FIG. 2B, a logic low (binary "0" data state) may correspond to a reduced concentration of majority charge carriers 34 (e.g., holes) in the electrically floating body region 18 relative to an unwritten memory cell 12 and/or a memory cell 12 that is written with a logic high (binary "1" data state).

The semiconductor memory device array 10 may further include data sense circuitry (not shown), coupled to the memory cell 12, to sense a data state of the memory cell 12. More specifically, in response to read control signals applied to the memory cell 12, the memory cell 12 may generate a second transistor current that is representative of a data state of the memory cell 12. The data sense circuitry may determine a data state of the memory cell 12 based at least substantially on the second transistor current (e.g., for a binary "1" data state) or a lack of the second transistor current (e.g., for a binary "0" data state).

The read control signals may include signals applied to the gate 16, source region 20, and drain region 22 to cause, force, and/or induce the second transistor current, which is representative of a data state of the memory cell 12. The read control signals applied to the gate 16, source region 20, and drain region 22 may include a positive voltage or a negative voltage. One or more of the read control signals may include a constant or unchanging voltage amplitude.

Figure 3:
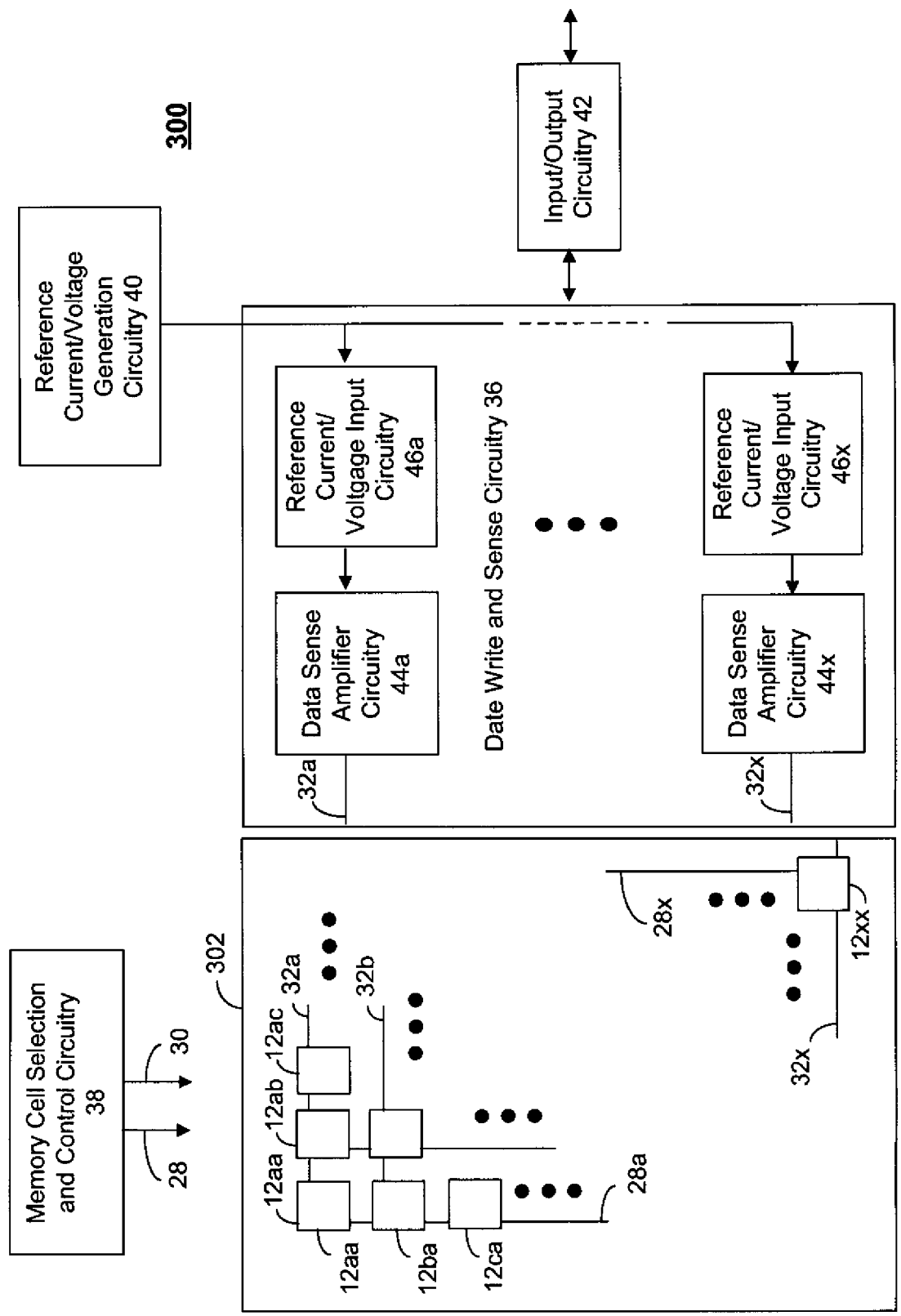
FIG. 3 shows a schematic block diagram of a semiconductor memory device in accordance with an embodiment of the present disclosure.

Referring to FIG. 3, there is shown a schematic block diagram of a semiconductor memory device 300 in accordance with an embodiment of the present disclosure. The semiconductor memory device 300 may include a memory cell array 302, data write and sense circuitry 36, memory cell selection and control circuitry 38, reference current and/or voltage generation circuitry 40, and input/output circuitry 42. The memory cell array 302 may include a plurality of memory cells 12 arranged in a matrix of rows and columns including a plurality of word lines 28 (WL), a plurality of source lines 30 (SL), and a plurality of bit lines 32 (BL). The memory cell array 302 may be coupled to the memory cell selection and control circuitry 38 via the word lines 28 (WL) and/or the source lines 30 (SL). Also, the memory cell array 302 may be coupled to the data write and sense circuitry 36 via the bit lines 32 (BL).

In an exemplary embodiment, the data write and sense circuitry 36 may include a plurality of data sense amplifier circuitry 44 (e.g., 44a-44x) and a plurality of reference current and/or voltage input circuitry 46 (e.g., 46a-46x). Each data sense amplifier circuitry 44 may receive at least one bit line (BL) 32 and the output of reference current and/or voltage generator circuitry 40 (for example, a current or voltage reference signal) via a corresponding reference current and/or voltage input circuitry 46. For example, each data sense amplifier circuitry 44 may be a cross-coupled type of sense amplifier to detect, determine, sense, and/or sample a data state of a memory cell 12. Each data sense amplifier circuitry 44 may detect a data state of one or more memory cells 12 (e.g., along bit lines 32a-32x (BL)) by comparing voltages or currents on a bit line (BL) 32 with voltages or currents of the output of the reference current and/or voltage generator circuitry 40. Also, a predetermined voltage may be applied to the bit lines 32 (BL) based at least in part on a data state determined by the data sense amplifier circuitry 44 to write-back the data state into memory cell 12.

The data sense amplifier circuitry 44 may employ voltage and/or current sensing circuitry and/or techniques. In an exemplary embodiment, the data sense amplifier circuitry 44 may employ a current sensing circuitry and/or techniques, the data sense amplifier circuitry 44 may compare current from the selected memory cell 12 to a reference current from the reference current and/or voltage input circuitry 46, for example, the current of one or more reference cells. From that comparison, it may be determined whether memory cell 12 contains a logic high (binary "1" data state, relatively more majority charge carriers 34 contained within the body region 18) or a logic low (binary "0" data state, relatively less majority charge carriers 34 contained within the body region 18). In another exemplary embodiment, the data sense amplifier circuitry 44 may employ a voltage sensing circuitry and/or techniques, the data sense amplifier circuitry 44 may compare voltage from the selected memory cell 12 to a reference voltage from the reference current and/or voltage input circuitry 46, for example, the voltage of one or more reference cells. From that comparison, it may be determined whether memory cell 12 contains a logic high (binary "1" data state, relatively more majority charge carriers 34 contained within the body region 18) or a logic low (binary "0" data state, relatively less majority charge carriers 34 contained within the body region 18). It may be appreciated by one having ordinary skill in the art that any type or form of data write and sense circuitry 36 (including one or more sense amplifiers, using voltage or current sensing techniques, to sense data stored in memory cells 12) may be employed to read data stored in memory cells 12 and/or write data to memory cells 12.

The memory cell selection and control circuitry 38 may select and/or enable one or more predetermined memory cells 12 to facilitate reading data therefrom and/or writing data thereto by applying control signals on one or more word lines 28 (WL) and/or source lines 30 (SL). The memory cell selection and control circuitry 38 may generate such control signals using address signals, for example, row address signals. Moreover, memory cell selection and control circuitry 38 may include a word line decoder and/or driver (not shown). For example, memory cell selection and control circuitry 38 may include one or more different control/selection techniques (and circuitry therefor) to implement memory cell selection techniques. Such techniques, and circuitry therefor, are well known to those skilled in the art. Notably, all such control/selection techniques, and circuitry therefor, whether now known or later developed, are intended to fall within the scope of the present disclosures.

In an exemplary embodiment, the semiconductor memory device 300 may implement a two step write operation whereby all memory cells 12 of a given row are written to a predetermined data state by first executing a "clear" operation, whereby all of the memory cells 12 of the given row may be written to a logic low (binary "0" data state), and thereafter selected memory cells 12 of the given row may be selectively written to the predetermined data state (e.g., a logic high (binary "1" data state)). In another exemplary embodiment, all memory cells 12 of a given row are written to a predetermined data state by first executing a "clear" operation, whereby all of the memory cells 12 of the given row may be written to a logic high (binary "1" data state), and thereafter selected memory cells 12 of the given row may be selectively written to the predetermined data state (e.g., a logic low (binary "0" data state)). In still another exemplary embodiment, a one step write operation may be implemented, whereby selective memory cells 12 of a given row are selectively written to either a logic high (binary "1" data state) or a logic low (binary "0" data state) without first implementing a "clear" operation.

The semiconductor memory device 300 may employ any of the exemplary writing, holding, and/or reading techniques described herein. Moreover, exemplary voltage values for each of the control signals for a given operation (for example, writing, holding or reading) may be employed in the semiconductor memory device 300 according to exemplary embodiments of the present disclosure.

The memory transistors 14 may comprise N-channel, P-channel, and/or both types of transistors. For example, the memory transistors 14 may be made from an SOI material/substrate or a bulk-type material/substrate. Also, the memory transistors 14 may comprise non-planar transistors, such as, vertical pillar transistors, cylindrical thin-pillar transistors, vertical gated access transistor, fin field effect transistors (FETs), multi-gate field effect transistors (MuGFETs), multiple independent gate field effect transistors (MIGFETs) and/or other multi-gate transistors. Indeed, circuitry that is peripheral to the memory array (for example, sense amplifiers or comparators, row and column address decoders, as well as line drivers (not illustrated herein)) may include P-channel and/or N-channel type transistors. In the event that P-channel type transistors are employed as memory transistors 14 in the memory cells 12, suitable write and read voltages (for example, negative voltages) may be well known to those skilled in the art in light of this disclosure. Accordingly, for sake of brevity, these discussions will not be repeated.

Figure 4:
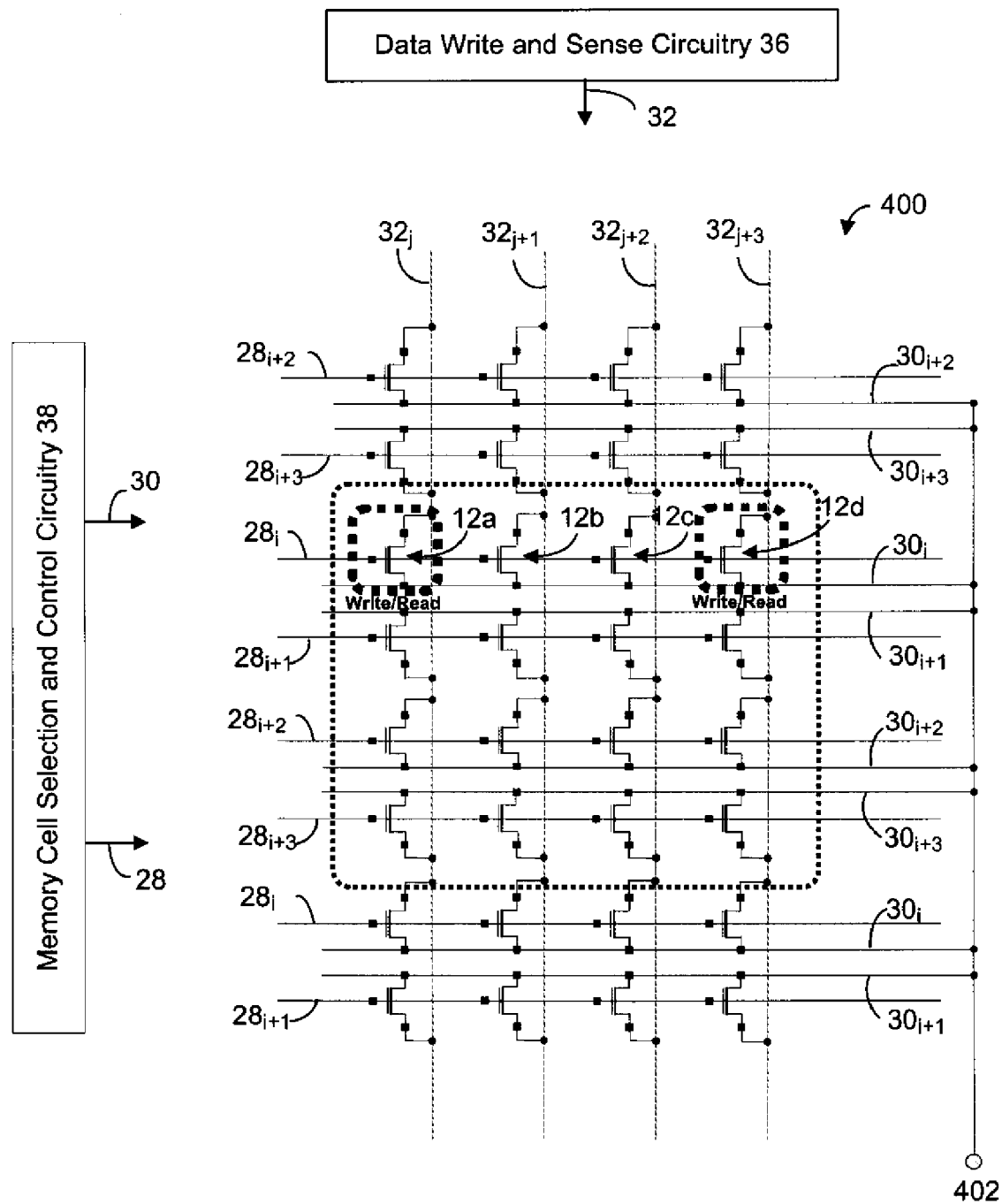
FIG. 4 shows an exemplary embodiment of a semiconductor memory device array having a plurality of memory cells and employing a separate source line configuration for each row of memory cells in accordance with an embodiment of the present disclosure.

Referring to FIG. 4, there is shown an exemplary embodiment of a semiconductor memory device array 400 having a plurality of memory cells 12 and a separate source line (SL) configuration for each row of memory cells 12 in accordance with an embodiment of the present disclosure. The semiconductor memory device array 400 may include a plurality of sub-arrays of memory cells 12 (e.g., a 4×4 sub-array enclosed by the dotted line). The semiconductor memory device array 400 may include data write and sense circuitry 36 coupled to a plurality of bit lines (BL) 32 of the plurality of memory cells 12 (e.g., $32_j$, $32_{j+1}$, $32_{j+2}$, and $32_{j+3}$). The semiconductor memory device array 400 may also include memory cell selection and control circuitry 38 coupled to a plurality of word lines (WL) 28 (e.g., $28_i$, $28_{i+1}$, $28_{i+2}$, and $28_{i+3}$) and/or a plurality of source lines (SL) 30 (e.g., $30_i$, $30_{i+1}$, $30_{i+2}$, and $30_{i+3}$). In an exemplary embodiment, the plurality of source lines (SL) 30 (e.g., $30_i$, $30_{i+1}$, $30_{i+2}$, and $30_{i+3}$) of the sub-array of memory cells 12 may be coupled to a constant power source 402 via a source line (SL) plane. For example, the constant power source 402 may be an internal voltage source and/or charge pump associated with the sub-array of memory cells 12 located within the semiconductor memory device array 400. Also, the constant power source 402 may be an external voltage source and/or charge pump coupled to the semiconductor memory device array 400. Therefore, the need for conventional source line (SL) drivers may be eliminated and space previously taken by conventional source line (SL) drivers in the semiconductor memory device array 400 may be reduced or eliminated by coupling the plurality of source lines (SL) 30 of the sub-array of memory cells 12 to the constant power source 402 via the source line (SL) plane.

At this point it should be noted that the source line (SL) plane may have a large surface area in order to accumulate a large amount of charge. Because a large amount of charge may accumulate in the source line (SL) plane, more current may be drawn from the source line (SL) plane with minimal voltage drop across the source line (SL) plane.

In an exemplary embodiment, the constant power source 402 may apply a voltage potential to the plurality of source lines 30 of the sub-array of memory cells 12 via the source line (SL) plane. The constant power source 402 may be a constant current (DC) source and/or a constant voltage source (e.g., battery). For example, the constant power source 402 may apply a voltage potential of approximately 2.0V to 3.0V to the plurality of source lines 30 (SL) of the sub-array of memory cells 12 via the source line (SL) plane. It may be appreciated by one skilled in the art that one or more factors may determine different voltage potentials that may be applied by the constant power source 402. For example, a voltage potential applied by the constant power source 402 to the source line (SL) plane of the sub-array of memory cells 12 may be based at least in part on an amount of stress associated the memory transistors 14 may tolerate. In an exemplary embodiment, the constant power source 402 may apply approximately 3.0V to the source region 20 of a memory transistor 14 of a memory cell 12 via an associated source line (SL) plane while approximately −1.5V may be applied to the gate 16 of the memory transistor 14 via an associated word line 28 (WL). Thus, the voltage potential differential between the source region 20 and the gate 16 (e.g., approximately 4.5V) may cause stress on the memory transistor 14 of the memory cell 12. The memory transistor 14 of the memory cell 12 may be fabricated to withstand the stress caused by the voltage potential differential between the source region 20 and the gate 16. Therefore, a voltage potential applied by the constant power source 402 may be determined by an amount of stress the memory transistor 14 may tolerate (e.g., determined by a fabrication method).

In another exemplary embodiment, the constant power source 402 may couple a reference point voltage potential to the source line (SL) plane of the sub-array of memory cells 12. For example, the constant power source 402 may apply a reference voltage potential of approximately 0V to the source line (SL) plane of the sub-array of memory cells 12. As such, the constant power source 402 may be a ground voltage potential and/or an earth voltage potential that is coupled to the plurality of source lines (SL) 30 of the sub-array of memory cells 12 via the source line (SL) plane. In an exemplary embodiment, the source line (SL) plane of the sub-array of memory cells 12 may be coupled to a ground/earth potential, and a bit line (BL) driver (not shown) may apply a high voltage potential (e.g., 3.0V) or a low voltage potential (e.g., 0V) to the drain region 22 of a memory transistor 14 in order to perform one or more operations (e.g., write, read, refresh, and/or inhibit).

As illustrated in FIG. 4, the sub-array of memory cells 12 may include four rows by four columns of memory cells 12 coupled to the constant power source 402 via the source line (SL) plane. It may be appreciated by one skilled in the art that the size (e.g., number of rows and columns) of the sub-array of memory cells 12 having the source line (SL) plane coupled to the constant power source 402 may vary. For example, the sub-array of memory cells 12 may include, but is not limited to, eight rows by eight columns, sixteen rows by sixteen columns, thirty-two rows by thirty-two columns, sixty-four rows by sixty-four columns, etc. Also, as discussed above, the source line (SL) plane may have a large surface area in order to accumulate a large amount of charge. However, the surface area of the source line (SL) plane may be limited by time restraints. For example, a source line (SL) plane having a large surface area may take a long time to perform a read and/or a write operation because of loading effects associated with word lines (WL) 28 and/or bit lines (BL) 32.

In an exemplary embodiment, a memory cell 12 in the sub-array of memory cells 12 may be written to using a two step operation wherein a first predetermined data state may be written to a given row of memory cells 12 by first executing a "clear" operation (in this exemplary embodiment, a selected row $28_i$ and/or all of the memory cells 12 of the given row may be written or programmed to a logic low (binary "0" date state)), and thereafter, a second predetermined data state may be written to selected memory cells 12 (i.e., a selective write operation to the second predetermined data state). The "clear" operation may be performed by writing a first predetermined data state to each memory cell 12 of the given row (in this exemplary embodiment, the first predetermined data state may be a logic low (binary "0" data state)) using the inventive technique described above. In another exemplary embodiment, a first predetermined data state may be written to a given row of memory cells 12 by first executing a "clear" operation (in this exemplary embodiment, a selected row 28$_i$ and/or all of the memory cells 12 of the given row may be written or programmed to a logic high (binary "1" date state)), and thereafter a second predetermined data state may be written to selected memory cells (i.e., a selective write operation to the second predetermined data state).

In particular, the memory transistor 14 of each memory cell 12 of a given row (e.g., memory cells 12a-12d) may be controlled to store a majority charge carrier concentration in the electrically floating body region 18 of the transistor 14, which corresponds to a logic low (binary "0" data state). For example, control signals to implement a "clear" operation may be applied to the gate 16, the source region 20, and the drain region 22 of the memory transistor 14 of each memory cell 12 of a given row (e.g., memory cells 12a-12d). In an exemplary embodiment, the "clear" operation may include applying (i) 0V to the gate 16, (ii) 0V to the source region 20 (e.g., the source line (SL) plane is coupled to a ground/earth), and (iii) 2.0V to the drain region 22 of the memory transistor 14. In another exemplary embodiment, the "clear" operation may include applying (i) 0V to the gate 16, (ii) 2.5V to the source region 20 (e.g., the source line (SL) plane is coupled a voltage potential), and (iii) 0.3V to 0.5V to the drain region 22 of the memory transistor 14. In response, the same logic state (e.g., a logic low (binary "0" data state)) may be stored in the memory cells 12a-12d and the state of the memory cells 12a-12d may be "cleared". In other exemplary embodiments, a "write reset" operation may be performed when the source line (SL) plane is coupled to a low constant voltage source. For example, a "write reset" operation may include applying (i) 2.5V to the gate 16, (ii) 0.0V to the source region 20 (e.g., the source line plane is coupled a low voltage potential), and (iii) 0.0V to the drain region 22 of the memory transistor 14.

Thereafter, the second predetermined logic state may be written to selected memory cells 12 of a given row. For example, the second predetermined logic state may be written to the memory transistors 14 of certain memory cells 12 of a given row in order to store the second predetermined logic state in the memory cells 12. For example, a logic high (binary "1" data state) may be written to memory cells 12a and 12d (as shown in the selected row 28$_i$), via an impact ionization effect and/or avalanche multiplication, by applying (i) 0V to the gate (via word line 28$_i$), (ii) 0V to the source region 20 (via source line plane 30$_i$ coupled to a ground/earth), and (iii) 2.5V to the drain region (via bit lines 32$_j$ and 32$_{j+3}$). Specifically, such control signals may generate or provide a bipolar current in the electrically floating body region 18 of the memory transistors 14 of memory cells 12a and 12d. The bipolar current may cause or produce impact ionization and/or avalanche multiplication in the electrically floating body region 18 of the memory transistors 14 of memory cells 12a and 12d. In this way, an excess of majority charge carriers may be provided and stored in the electrically floating body region 18 of the memory transistors 14 of memory cells 12a and 12d, which corresponds to a logic high (binary "1" data state).

In an exemplary embodiment, memory cells 12b and 12c (as shown in selected row 28$_i$) may be maintained at a logic low (binary "0" data state) by applying a voltage to inhibit impact ionization in the drain regions 22 of memory cells 12b and 12c. For example, applying 0V to the drain regions 22 of memory cells 12b and 12c (via bit lines 32$_{j+1}$ and 32$_{j+2}$) may inhibit impact ionization in memory cells 12b and 12c during the selective write operation for memory cells 12a and 12d.

A selected row of memory cells 12 may be read by applying read control signals to an associated word line (WL) 28 and an associated source line (SL) 30 and sensing a signal (voltage and/or current) on associated bit lines (BL) 32. In an exemplary embodiment, memory cells 12a-12d (e.g., as shown in the selected row 28$_i$) may be read by applying to each respective memory transistor 14 (i) 0V to the gate 16 (via word line 28$_i$), (ii) 0V to the source region 20 (via the source line (SL) plane coupled to the constant power source 402), and (iii) 2.5V to the drain region 22 (via associated bit lines 32). The data write and sense circuitry 36 may read the data state of the memory cells 12a-12d by sensing the response to the read control signals applied to word line 28$_i$, source line 30, and bit line 32. In response to the read control signals, the memory cells 12a-12d may generate a bipolar transistor current which may be representative of the data state of the memory cells 12a-12d. For example, memory cells 12a and 12d (which were earlier written to a logic high (binary "1" data state)), in response to the read control signals, may generate a bipolar transistor current which is considerably larger than a channel current. In contrast, in memory cells 12b and 12c (which were earlier programmed to a logic low (binary "0" data state)), such read control signals induce, cause, and/or produce little to no bipolar transistor current (for example, a considerable, substantial, or sufficiently measurable bipolar transistor current). The data write and sense circuitry 36 senses the data state (e.g., via a cross-coupled sense amplifier) using primarily and/or based substantially on the bipolar transistor current.

Thus, in response to the read control signals, the memory transistor 14 of each memory cell 12a-12d may generate a bipolar transistor current which is representative of the data state stored therein. The data write and sense circuitry 36 may determine the data states of memory cells 12a-12h based substantially on the bipolar transistor current induced, caused, and/or produced in response to the read control signals. In another exemplary embodiment, the data write and sense circuitry 36 may compare a reference voltage with the bipolar transistor current/voltage induced, caused, and/or produced in response to the read control signals. Thereafter, the data write and sense circuitry 36 may determine the data states of memory cells 12-12h based substantially on the reference voltage.

Figure 5:
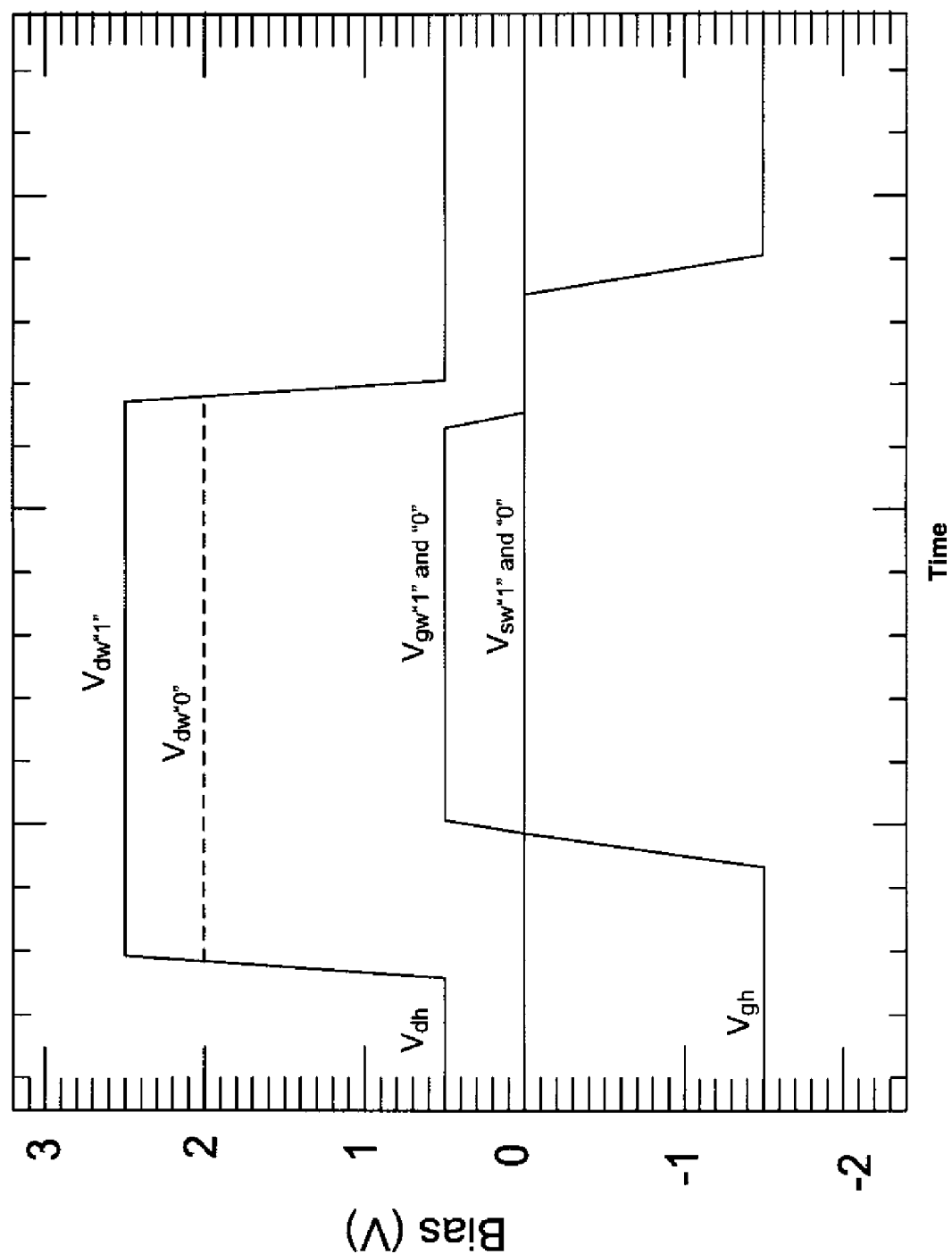
FIG. 5 shows a diagram of voltage control signals to implement a write operation to a memory cell for a source line plane coupled to a low voltage constant power source in accordance with an embodiment of the present disclosure.

FIG. 5 shows a diagram of voltage control signals to implement a write operation to a memory cell for a source line plane coupled to a low voltage constant power source in accordance with an exemplary embodiment of the present disclosure. The control signals may be configured to eliminate source line (SL) drivers by coupling a source line (SL) plane to a constant power source. Also, selective memory cells 12 of a selected row of memory cells 12 may be selectively written or programmed to either a logic high (binary "1" data state) or a logic low (binary "0" date state) without first implementing a "clear" operation. For example, temporally varying control signals to implement a write logic high (binary "1" data state) operation to a memory transistor 14 of a memory cell 12 may include a voltage applied to the gate 16 ($V_{gw\text{"}1\text{"}}$), a voltage applied to the source region 20 ($V_{sw\text{"}1\text{"}}$), and a voltage applied to the drain region 22 ($V_{dw\text{"}1\text{"}}$). The logic high (binary "1" data state) may be written to one or more selected memory cells 12 by applying appropriate word line (WL) voltages and/or appropriate bit line (BL) voltages. For example, a source voltage ($V_{sw\text{"}1\text{"}}$) of approximately 0V may be applied to the source region 20 (via, for example, the associated source line plane coupled to a ground/earth) and a drain voltage ($V_{dw\text{“}1\text{”}}$) of approximately 2.5V may be applied to the drain region 22 (via, for example, the associated selected bit line $32_j$ and $32_{j+3}$) of the memory transistor 14 of the memory cell 12 before a gate voltage ($V_{gw\text{“}1\text{”}}$) of approximately 0.5V may be applied to the gate 16 (via, for example, the associated selected word line $28_i$), simultaneously thereto, or after the gate voltage ($V_{gw\text{“}1\text{”}}$) is applied to gate 16. It is preferred that the drain voltage ($V_{dw\text{“}1\text{”}}$) may include an amplitude which may be sufficient to maintain a bipolar current that is suitable for programming the memory cell 12 to a logic high (binary "1" data state). From a relative timing perspective, it is preferred that the drain voltage ($V_{dw\text{“}1\text{”}}$) may extend beyond/after or continue beyond the conclusion of the gate voltage ($V_{gw\text{“}1\text{”}}$), or extend beyond/after or continue beyond the time the gate voltage ($V_{gw\text{“}1\text{”}}$) is reduced. Therefore, majority charge carriers 34 may be generated in the electrically floating body region 18 via a bipolar current and majority charge carriers may 34 accumulate (and be stored) in a portion of the electrically floating body region 18 of the memory transistor 14 of the memory cell 12 near the gate dielectric 17 (which is disposed between the gate 16 and the electrically floating body region 18).

In another exemplary embodiment, temporally varying control signals may be implemented to write a logic low (binary "0" data state), including a voltage applied to the gate 16 ($V_{gw\text{“}0\text{”}}$), a voltage applied to the source 20 ($V_{sw\text{“}0\text{”}}$), and a voltage applied to the drain region 22 ($V_{dw\text{“}0\text{”}}$ shown by the dotted line). For example, a source voltage ($V_{sw\text{“}0\text{”}}$) of approximately 0V may be applied to the source region 20 (via, for example, the source line plane coupled to a ground/earth) and a drain voltage of approximately 2.0V may be applied to the drain region 22 ($V_{dw\text{“}0\text{”}}$ shown by the dotted line), may be applied before a gate voltage ($V_{gw\text{“}0\text{”}}$) of approximately 0.5V is applied to the gate 16, or simultaneously thereto, or after the gate voltage ($V_{gw\text{“}0\text{”}}$) is applied to the gate 16. Particularly, the drain voltage ($V_{dw\text{“}0\text{”}}$ shown by the dotted line) may include an amplitude which may be insufficient to maintain a bipolar current that is suitable for writing a logic high (binary "1" data state) to the memory cell 12 to. From a relative timing perspective, it may be preferred that the drain voltage ($V_{dw\text{“}0\text{”}}$ shown by the dotted line) may extend beyond/after or continue beyond the conclusion of the gate voltage ($V_{gw\text{“}0\text{”}}$), or extend beyond/after or continue beyond the time the gate voltage ($V_{gw\text{“}0\text{”}}$) is reduced. For example, majority charge carriers 34 may be generated in the electrically floating body region 18 via a bipolar current and majority charge carriers 34 may accumulate (and be stored) in a portion of the electrically floating body region 18 of the memory transistor 14 of the memory cell 12 near the gate dielectric 17 (which is disposed between the gate 16 and the electrically floating body region 18).

Figure 6:
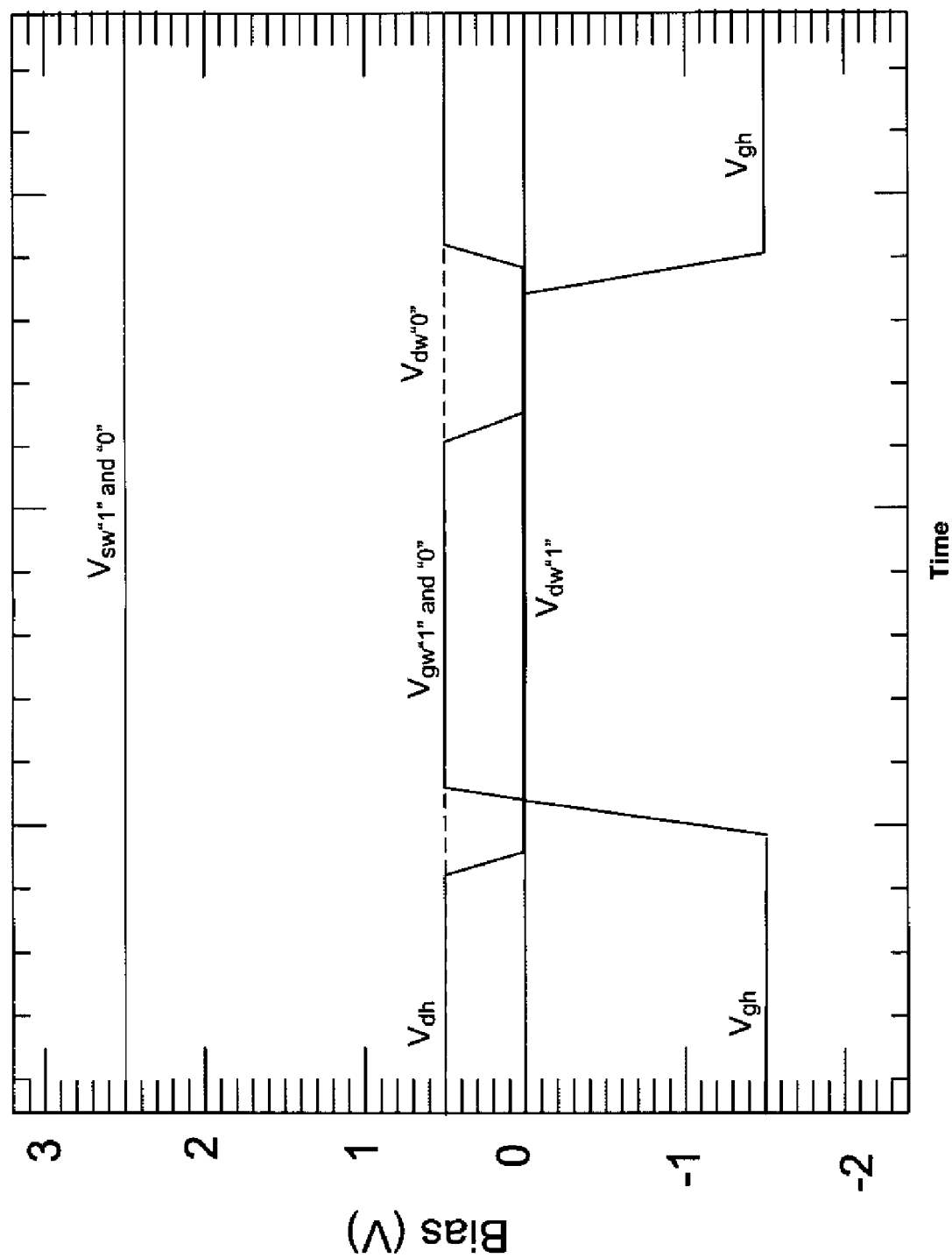
FIG. 6 shows a diagram of voltage control signals to implement a write operation to a memory cell for a source line plane coupled to a high voltage constant power source in accordance with an embodiment of the present disclosure.

FIG. 6 shows a diagram of voltage control signals to implement a write operation to a memory cell for a source line plane coupled to a high voltage constant power source in accordance with an embodiment of the present disclosure. The control signals may be configured to eliminate source line (SL) drivers by coupling a source line (SL) plane to a constant power source. Also, selective memory cells 12 of a selected row of memory cells 12 may be selectively written or programmed to either a logic high (binary "1" data state) or a logic low (binary "0" date state) without first implementing a "clear" operation. For example, temporally varying control signals to implement a write logic high (binary "1" data state) operation to a memory transistor 14 of a memory cell 12 may include a voltage applied to the gate 16 ($V_{gw\text{“}1\text{”}}$), a voltage applied to the source region 20 ($V_{sw\text{“}1\text{”}}$), and a voltage applied to the drain region 22 ($V_{dw\text{“}1\text{”}}$). The logic high (binary "1" data state) may be written to one or more selected memory cells 12 by applying appropriate word line (WL) voltages and/or appropriate bit line (BL) voltages. For example, a source voltage ($V_{sw\text{“}1\text{”}}$) of approximately 2.5V may be applied to the source region 20 (via, for example, the associated source line plane coupled to a voltage potential) and a drain voltage ($V_{dw\text{“}1\text{”}}$) of approximately 0V may be applied to the drain region 22 (via, for example, the associated selected bit line $32_j$ and $32_{j+3}$) of the memory transistor 14 of the memory cell 12 before a gate voltage ($V_{gw\text{“}0\text{”}}$) of approximately 0.5V may be applied to the gate 16 (via, for example, the associated selected word line $28_i$), simultaneously thereto, or after the gate voltage ($V_{gw\text{“}1\text{”}}$) is applied to gate 16. It is preferred that the drain voltage ($V_{dw\text{“}1\text{”}}$) may include an amplitude which may be sufficient to maintain a bipolar current that is suitable for programming the memory cell 12 to a logic high (binary "1" data state). From a relative timing perspective, it is preferred that the drain voltage ($V_{dw\text{“}1\text{”}}$) may extend beyond/after or continue beyond the conclusion of the gate voltage ($V_{gw\text{“}1\text{”}}$), or extend beyond/after or continue beyond the time the gate voltage ($V_{gw\text{“}1\text{”}}$) is reduced. Therefore, majority charge carriers 34 may be generated in the electrically floating body region 18 via a bipolar current and majority charge carriers 34 may accumulate (and be stored) in a portion of the electrically floating body region 18 of the memory transistor 14 of the memory cell 12 near the gate dielectric 17 (which is disposed between the gate 16 and the electrically floating body region 18).

In another exemplary embodiment, temporally varying control signals may be implemented to a write logic low (binary "0" data state), including a voltage applied to the gate 16 ($V_{gw\text{“}0\text{”}}$), a voltage applied to the source 20 ($V_{sw\text{“}0\text{”}}$), and a voltage applied to the drain region 22 ($V_{dw\text{“}0\text{”}}$ shown by the dotted line). For example, a source voltage ($V_{sw\text{“}0\text{”}}$) of approximately 2.5V may be applied to the source region 20 (via, for example, the source line plane coupled to a voltage potential) and a drain voltage of approximately 0.5V may be applied to the drain region 22 ($V_{dw\text{“}0\text{”}}$ shown by the dotted line), may be applied before a gate voltage ($V_{gw\text{“}0\text{”}}$) of approximately 0.5V is applied to the gate 16, or simultaneously thereto, or after the gate voltage ($V_{gw\text{“}0\text{”}}$) is applied to the gate 16. Particularly, the drain voltage ($V_{dw\text{“}0\text{”}}$ shown by the dotted line) may include an amplitude which may be insufficient to maintain a bipolar current that is suitable for writing a logic high (binary "1" data state) to the memory cell 12 to. From a relative timing perspective, it may be preferred that the drain voltage ($V_{dw\text{“}0\text{”}}$ shown by the dotted line) may extend beyond/after or continue beyond the conclusion of the gate voltage ($V_{gw\text{“}0\text{”}}$), or extend beyond/after or continue beyond the time the gate voltage ($V_{gw\text{“}0\text{”}}$) is reduced. For example, majority charge carriers 34 may be generated in the electrically floating body region 18 via a bipolar current and majority charge carriers 34 may accumulate (and be stored) in a portion of the electrically floating body region 18 of the memory transistor 14 of the memory cell 12 near the gate dielectric 17 (which is disposed between the gate 16 and the electrically floating body region 18).

Figure 7:
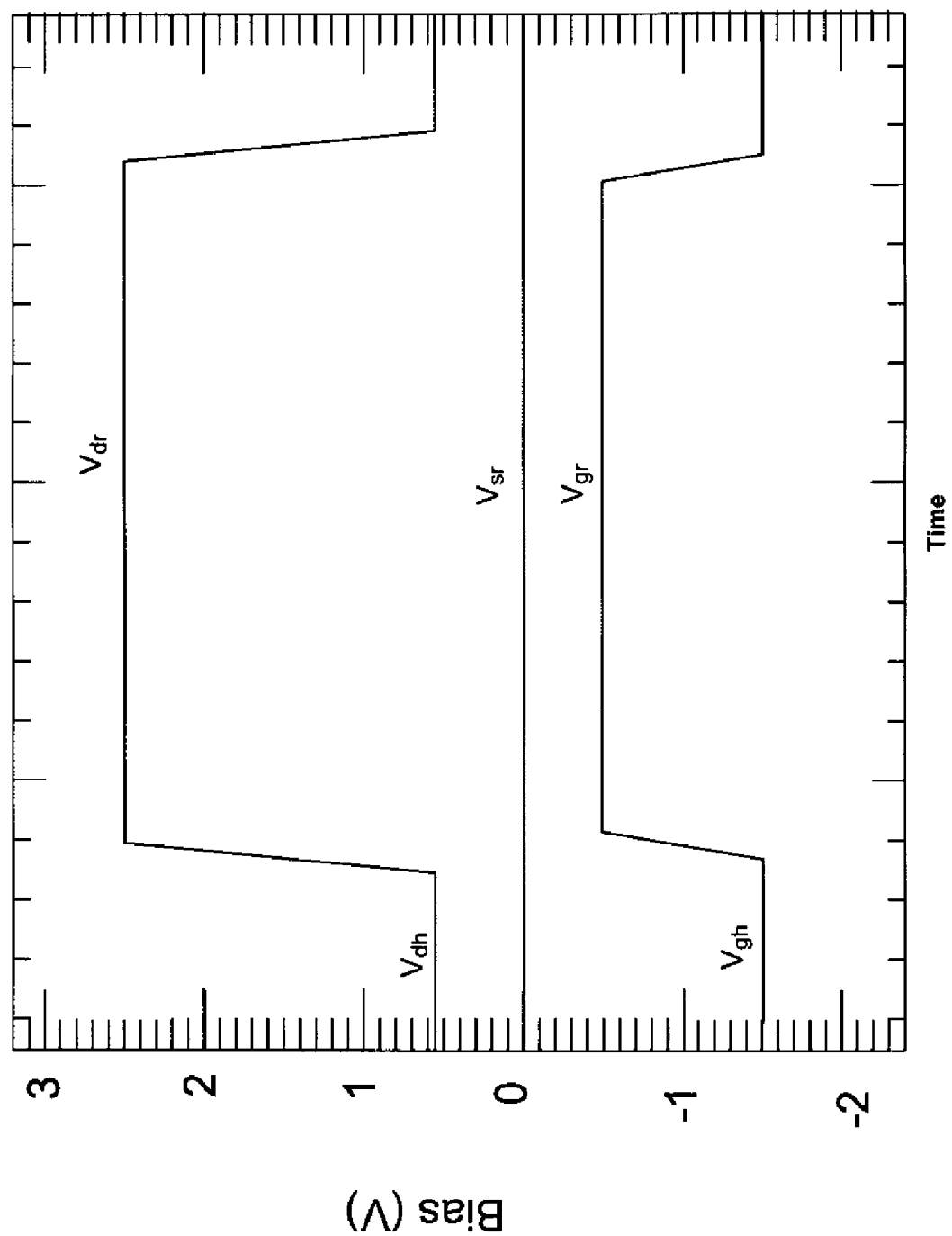
FIG. 7 shows a diagram of voltage control signals to implement a read operation of a memory cell for a source line plane coupled to a low voltage constant power source in accordance with an embodiment of the present disclosure.

FIG. 7 shows a diagram of voltage control signals to implement a read operation of a memory cell for a source line plane coupled to a low voltage constant source in accordance with an embodiment of the present disclosure. For example, read control signals may be applied to the source region 20, the drain region 22, and the gate 16. A source voltage ($V_{sr}$) of approximately 0V may be applied to the source region 20 (via, for example, coupling source line plane to a ground/ earth) and a drain voltage ($V_{dr}$) of approximately 2.5V may be applied to the drain region 22, before application of a gate voltage ($V_{gr}$) of approximately −0.5V applied to the gate 16, simultaneously thereto, or after the gate voltage ($V_{gr}$) is applied to the gate 16. Further, the drain voltage ($V_{dr}$) may extend beyond/after or continue beyond the conclusion of the gate voltage ($V_{gr}$), simultaneously thereto (as illustrated in FIG. 7), or before the gate voltage ($V_{gr}$) may conclude or cease.

In an exemplary embodiment, during the read operation, a bipolar current may be generated in memory cells 12 storing a logic high (binary "1" data state) and little to no bipolar current may be generated in memory cells 12 storing a logic low (binary "0" data state). The data state may be determined primarily by, sensed substantially using, and/or based substantially on the bipolar transistor current that is responsive to the read control signals and significantly less by an interface channel current component, which is less significant and/or negligible relatively to the bipolar component.

Figure 8:
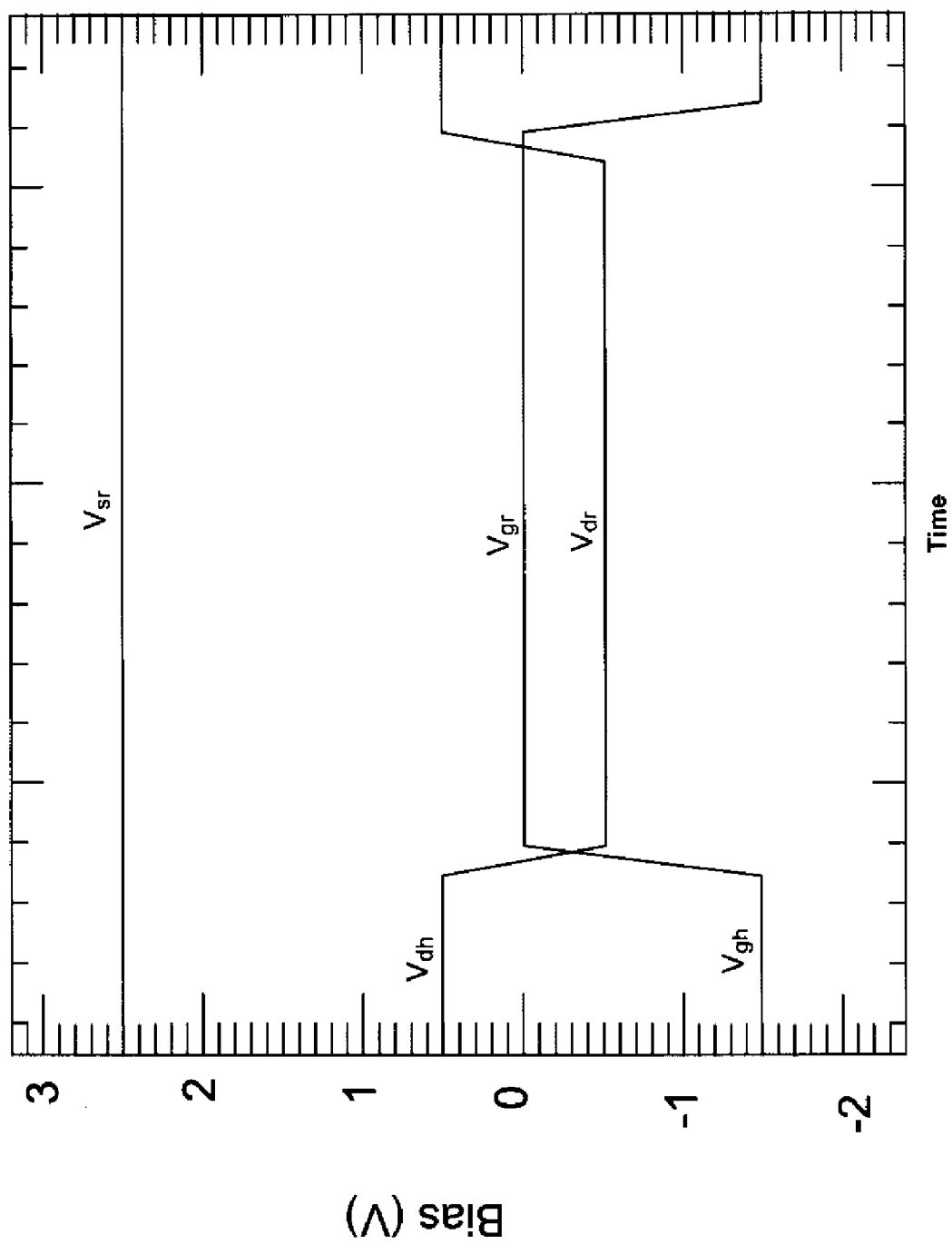
FIG. 8 shows a diagram of voltage control signals to implement a read operation of a memory cell for a source line plane coupled to a high voltage constant power source in accordance with an embodiment of the present disclosure.

FIG. 8 shows a diagram of voltage control signals to implement a read operation of a memory cell for a source line plane coupled to a high voltage constant power source in accordance with an embodiment of the present disclosure. For example, read control signals may be applied to the source region 20, the drain region 22, and the gate 16. A source voltage ($V_{sr}$) of approximately 2.5V may be applied to the source region 20 (via, for example, coupling source line plane to a voltage potential) and a drain voltage ($V_{dr}$) of approximately −0.5V may be applied to the drain region 22, before application of a gate voltage ($V_{gr}$) of approximately 0V applied to the gate 16, simultaneously thereto, or after the gate voltage ($V_{gr}$) is applied to the gate 16. Further, the drain voltage ($V_{dr}$) may extend beyond/after or continue beyond the conclusion of the gate voltage ($V_{gr}$), simultaneously thereto (as illustrated in FIG. 8), or before the gate voltage ($V_{gr}$) may conclude or cease.

The writing and reading techniques described herein may be employed in conjunction with a plurality of memory cells 12 arranged in an array of memory cells. A memory array implementing the structure and techniques of the present disclosure may include a plurality of memory cells 12 having a common source line (SL) for each row of memory cells 12. Exemplary layouts and configurations (including exemplary control signal voltage values) are shown, in accordance to one or more exemplary embodiments of the present disclosure, each consisting of control signal waveforms and exemplary array voltages during one-step writing and reading.

Accordingly, the voltage levels to implement the write and read operations as described herein are merely exemplary. The indicated voltage levels may be relative or absolute. Alternatively, the voltages indicated may be relative in that, for example, each voltage level may be increased or decreased by a given voltage amount (e.g., each voltage may be increased or decreased by 0.5V, 1.0V and 2.0V) whether one or more of the voltages (e.g., the source region voltage, the drain region voltage, or the gate voltage) become or are positive and negative.

Figure 9A:
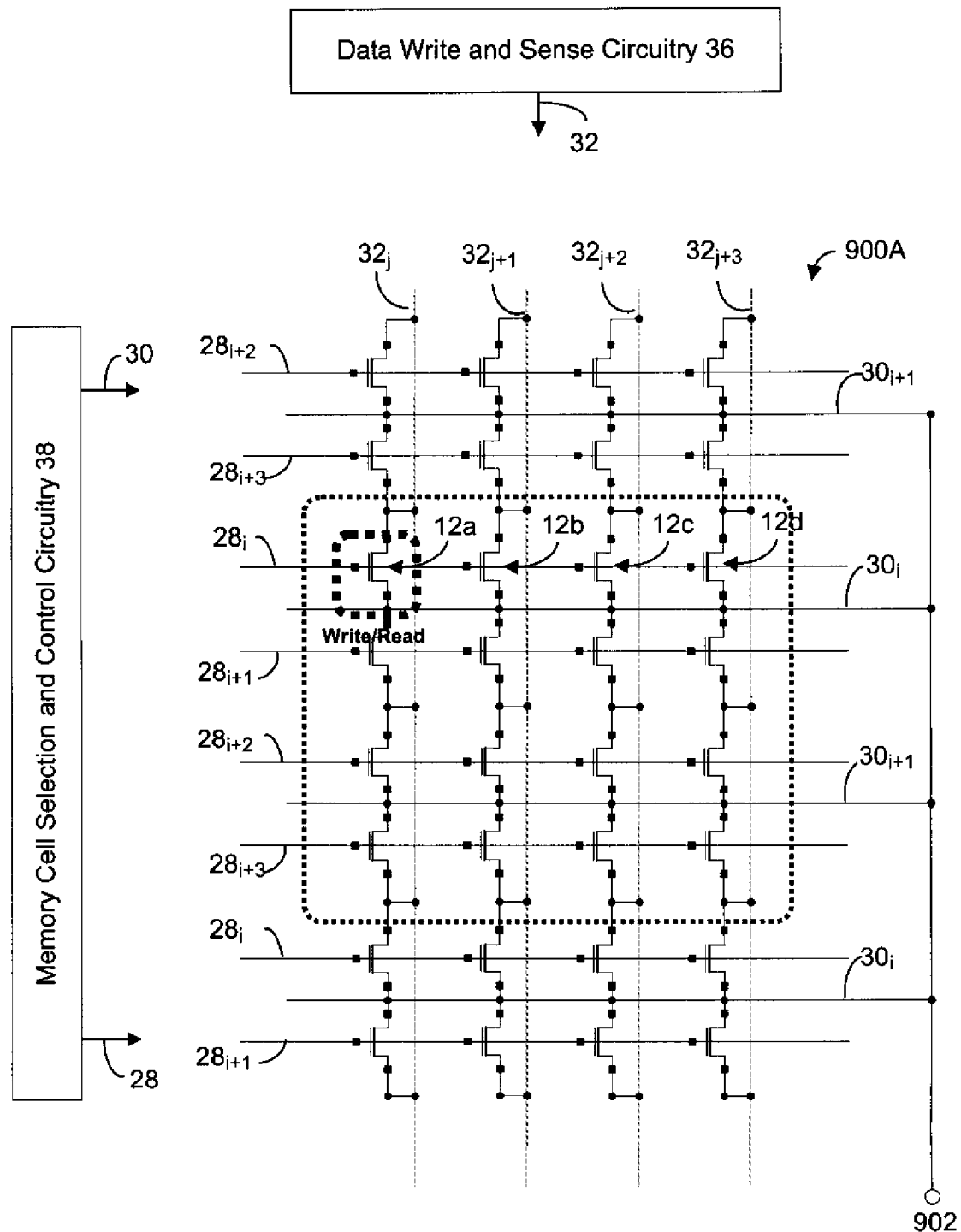
FIG. 9A shows an exemplary embodiment of a semiconductor memory device array having a plurality of memory cells and a common source line plane in accordance with an embodiment of the present disclosure.

Referring to FIG. 9A, there is shown a schematic of a semiconductor memory device array 900A having a plurality of memory cells 12 and a common source line 30 (SL) plane in accordance with an exemplary embodiment of the present disclosure. As mentioned above, the techniques of the present disclosure may be implemented in any memory array architecture having a plurality of memory cells 12 that employ memory transistors 14. For example, as illustrated in FIG. 9A, the semiconductor memory device array 900A implementing the structure and techniques of the present disclosure may be controlled and configured having a common source line (SL) for every two rows of memory cells 12 (a row of memory cells 12 includes a common word line 28 (WL)). The semiconductor memory device array 900A may include a plurality of sub-arrays of memory cells 12 (e.g., the 4×4 sub-array enclosed by the dotted line). The semiconductor memory device array 900A may include data write and sense circuitry 36 coupled to a plurality of bit lines (BL) 32 of a sub-array of memory cells 12 (e.g., $32_j$, $32_{j+1}$, $32_{j+2}$, and $32_{j+3}$). Also, the semiconductor memory device array 900A may include memory cell selection and control circuitry 38 coupled to a plurality of word lines 28 (WL) (e.g., $28_i$, $28_{i+1}$, $28_{i+2}$, and $28_{i+3}$) and/or a plurality of source lines (SL) 30 (e.g., having source lines $30_i$ and $30_{i+1}$) coupled to a source line (SL) plane. In an exemplary embodiment, the plurality of source lines 30 (SL) (e.g., $30_i$ and $30_{i+1}$) of the sub-array of memory cells 12 may be coupled to a constant power source 902 via a source line (SL) plane. For example, the constant power source 902 may be an internal voltage source and/or a charge pump associated with the sub-array of memory cells 12 located within the semiconductor memory device array 900A. Also, the constant power source 902 may be an external voltage source and/or a charge pump coupled to the semiconductor memory device array 900A. Therefore, the need for conventional source line (SL) drivers may be eliminated and space previously taken by conventional source line (SL) drivers in the semiconductor memory device array 900A may be reduced or eliminated by coupling the plurality of source lines (SL) 30 of the sub-array of memory cells 12 to the constant power source 902 via the source line (SL) plane.

In an exemplary embodiment, the constant power source 902 may apply a voltage potential to the source line (SL) plane of the sub-array of memory cells 12 of the semiconductor memory device array 900A. For example, the constant power source 902 may apply a voltage potential of approximately 2.0V to 3.0V to the source line (SL) plane of the sub-array of the semiconductor memory device array 900A. It may be appreciated by one skilled in the art that one or more factors may determine different voltage potentials that may be applied by the constant power source 902. For example, a voltage potential applied by the constant power source 902 to the source line (SL) plane of the sub-array memory cells 12 of the semiconductor memory device array 900A may be based at least in part on an amount of stress associated memory transistors 14 of the sub-array of the memory cells 12 may tolerate. In an exemplary embodiment, the constant power source 902 may apply approximately 3.0V to the source region 20 of a memory transistor 14 of a memory cell 12 via an associated source line (SL) plane, while approximately −1.5V may be applied to the gate 16 of the memory transistor 14 of the memory cell 12 via an associated word line 28 (WL). The voltage potential differential (e.g., approximately 4.5V) between the source region 20 and the gate 16 may cause stress on the memory transistor 14 of the memory cell 12. The memory transistor 14 of the memory cell 12 may be fabricated to withstand the stress caused by the voltage potential differential between the source region 20 and the gate 16. Therefore, a voltage potential applied by the constant power source 902 may be determined by an amount of stress the memory transistor 14 may tolerate (e.g., determined by a fabrication method).

In another exemplary embodiment, the constant power source 902 may apply a relatively low voltage potential to the source line (SL) plane of the sub-array memory cells 12 of the semiconductor memory device array 900A. For example, the constant power source 902 may apply a voltage potential of approximately 0V to the source line (SL) plane of the sub-array of memory cells 12 of the semiconductor memory device array 900A. As such, the constant power source 402 may be a ground voltage potential and/or an earth voltage potential that is coupled to the plurality of source lines (SL) 30 of the sub-array of memory cells 12 via the source line (SL) plane. In an exemplary embodiment, the source line (SL) plane of the sub-array of memory cells 12 of the semiconductor memory device array 900A may be coupled to a ground/earth potential, and a bit line (BL) driver (not shown) may apply a high voltage potential (e.g., 3.0V) or a low voltage potential (e.g., 0V) to the drain region 22 of a memory transistor 14 in order to perform one or more operations (e.g., write, read, refresh, and/or inhibit).

As illustrated in FIG. 9A, the sub-array of memory cells 12 of the semiconductor memory device array 900A may include four rows by four columns of memory cells 12 having a plurality of common source lines 30 (SL) coupled to the constant power source 902 via the source line (SL) plane. It may be appreciated by one skilled in the art that the sub-array of memory cells 12 having the plurality of common source lines 30 (SL) coupled to the constant power source 902 via the source line (SL) plane may be any size. For example, the sub-array of memory cells 12 may include, but is not limited to, eight rows by eight columns, sixteen rows by sixteen columns, thirty-two rows by thirty-two columns, sixty-four rows by sixty-four columns, etc.

An example (including exemplary control signal voltage values) according to certain aspects of the present disclosure may be also shown that comprises control signal waveforms and exemplary array voltages during a writing operation and/or a reading operation. For example, temporally varying control signals to implement a write operation may include (i) a voltage ($V_{sw}$) applied to the source region 20 via an associated source line 30 (SL), (ii) a voltage ($V_{gw}$) applied to the gate 16 via an associated word line 28 (WL), and (iii) a voltage ($V_{dw}$) applied to the drain region 22 via an associated bit line 32 (BL) (as shown in FIGS. 5 and 6). The binary "1" or "0" data states may be written to one or more selected memory cells 12 by applying appropriate word line 28 (WL) voltages and/or bit line 32 (BL) voltages. Also, read control signals may be applied to the source region 20, the drain region 22, and the gate 16 (as shown in FIGS. 7 and 8).

Figure 9B:
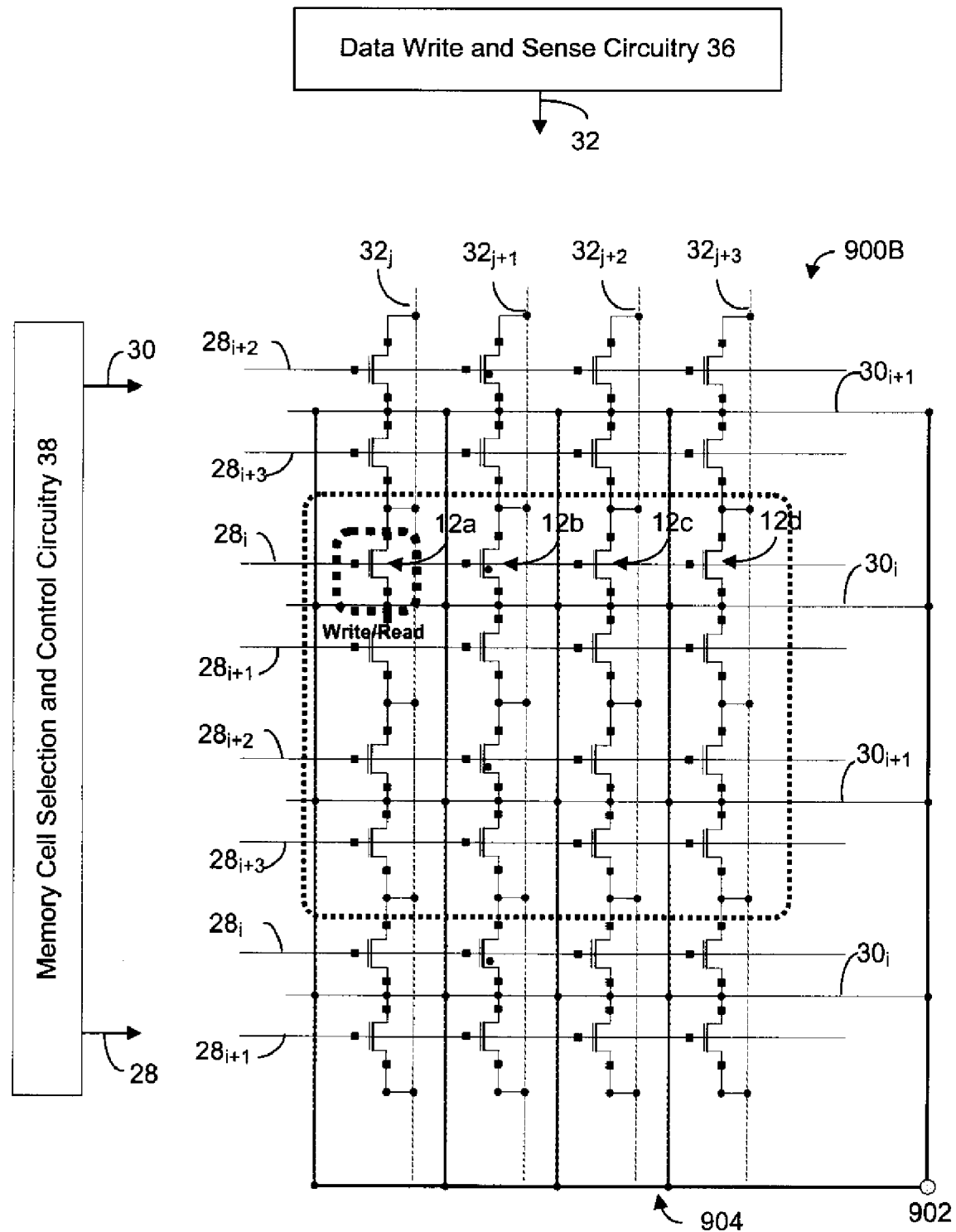
FIG. 9B shows an exemplary embodiment of a semiconductor memory device array having a plurality of memory cells and a common source line plane in accordance with an alternative embodiment of the present disclosure.

Referring to FIG. 9B, there is shown a schematic of a semiconductor memory device array 900B having a plurality of memory cells 12 and a common source line 30 (SL) plane in accordance with an alternative embodiment of the present disclosure. The semiconductor memory device array 900B may be implemented with the structure and techniques similar to that of the semiconductor memory device array 900A shown in FIG. 9A, except that the semiconductor memory device array 900B comprises a source line grid 904. In an exemplary embodiment, a source line plane may be formed from the source line grid 904. For example, the semiconductor memory device array 900B may include a plurality of sub-arrays of memory cells 12 (e.g., a 4×4 sub-array enclosed by the dotted line). Each memory cell 12 may include a memory transistor 14, wherein the memory transistor 14 may be a planar transistor or non-planar transistor made from an SOI material/substrate or a bulk-type material/substrate, as discussed above. The semiconductor memory device array 900B may include data write and sense circuitry 36 coupled to a plurality of bit lines (BL) 32 of a sub-array of memory cells 12 (e.g., $32_j$, $32_{j+1}$, $32_{j+2}$, and $32_{j+3}$). Also, the semiconductor memory device array 900B may include memory cell selection and control circuitry 38 coupled to a plurality of word lines 28 (WL) (e.g., $28_i$, $28_{i+1}$, $28_{i+2}$, and $28_{i+3}$) and/or a plurality of source lines (SL) 30 (e.g., source lines $30_i$ and $30_{i+1}$) coupled to a source line (SL) plane. In an exemplary embodiment, the plurality of source lines 30 (SL) (e.g., $30_i$ and $30_{i+1}$) of the sub-array of memory cells 12 may be coupled to a constant power source 902 via the source line (SL) grid 904. The source line (SL) grid 904 may include a plurality of horizontal and/or vertical source lines (SL) coupling the memory cells 12 to the constant power source 902. In another exemplary embodiment, a source line plane may be formed from a source line plate having a single plate and coupling the memory cells 12 to the constant power source 902. Moreover, a source line plane may include a plurality of sub-layers of source line grids and/or source line plates coupling the memory cells 12 to the constant power source 902.

Figure 10:
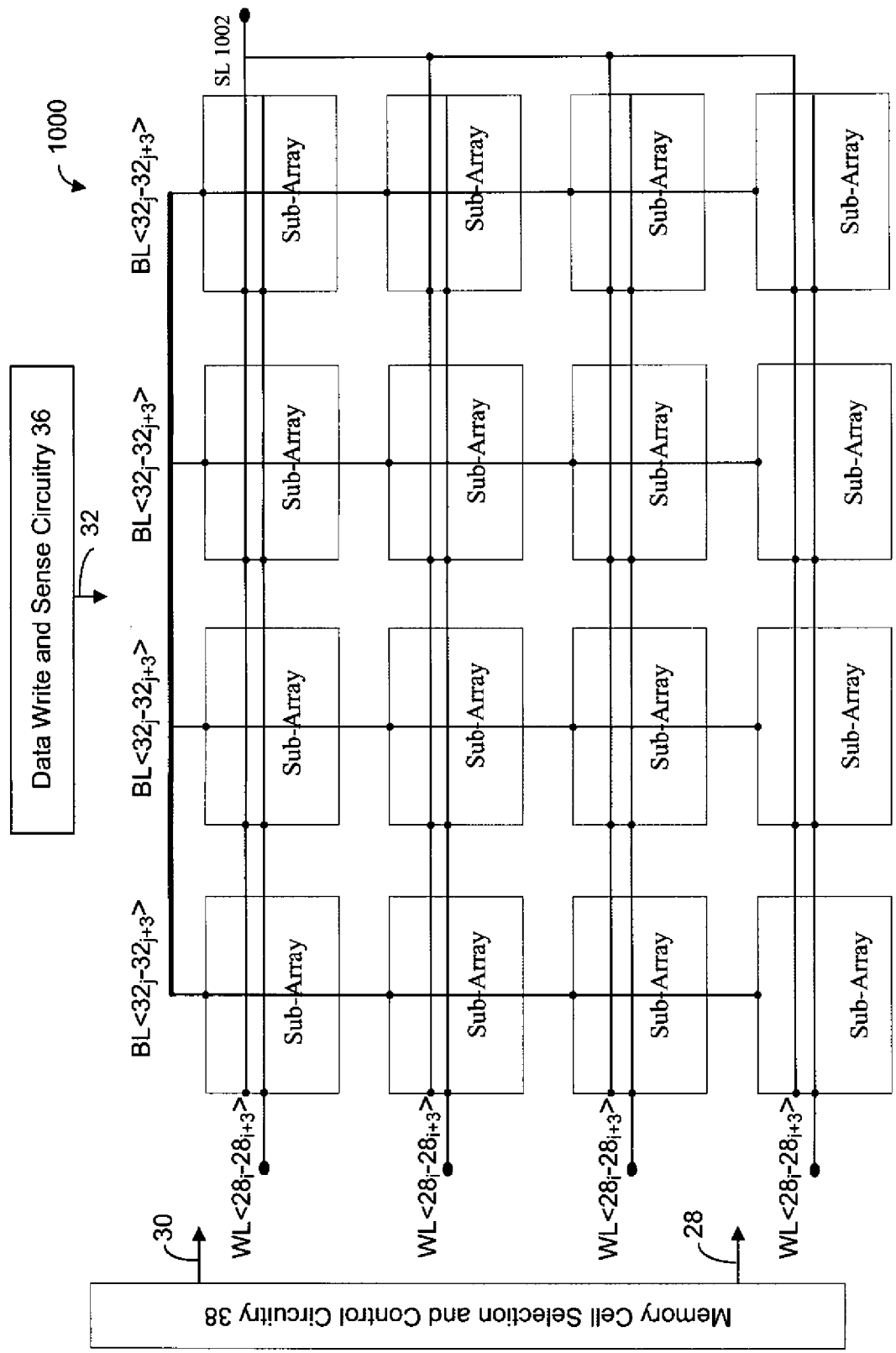
FIG. 10 shows a diagram of a plurality of sub-arrays of a semiconductor memory device in accordance with an embodiment of the present disclosure.

FIG. 10 shows a diagram of a plurality of sub-arrays of memory cells 12 of a semiconductor memory device 1000 in accordance with an exemplary embodiment of the present disclosure. The plurality of sub-arrays of memory cells 12 of the semiconductor memory device 1000 may be coupled to data write and sense circuitry 36 via a plurality of bit lines (BL) 32 associated with each of the plurality of sub-arrays of memory cells 12 (e.g., $32_j$, $32_{j+1}$, $32_{j+2}$, and $32_{j+3}$, as shown in FIGS. 4, 9A and 9B). Also, the plurality of sub-arrays of memory cells of the semiconductor memory device 1000 may be coupled to memory cell selection and control circuitry 38 via a plurality word lines (WL) 28 associated with each of the plurality of sub-arrays of memory cells 12 (e.g., $28_i$, $28_{i+1}$, $28_{i+2}$, and $28_{i+3}$, as shown in FIGS. 4, 9A and 9B). In addition, the plurality of sub-arrays of memory cells 12 may be coupled to the memory cell selection and control circuitry 38 via a plurality of source lines (SL) 30 associated with each of the plurality of sub-arrays of memory cells 12 (e.g., $30_i$, $30_{i+1}$, $30_{i+2}$, and $30_{i+3}$, as shown in FIGS. 4, 9A, and 9B). As described above, the source lines (SL) 30 (e.g., $30_i$, $30_{i+1}$, $30_{i+2}$, and $30_{i+3}$) associated with each of the plurality of sub-arrays of memory cells 12 may be coupled to an auxiliary source line (SL) plane and a constant power source 1002. In an exemplary embodiment, each auxiliary source line (SL) plane associated with each of the plurality of sub-arrays of memory cells 12 of the semiconductor memory device 1000 may be coupled together to form a comprehensive source line (SL) plane (e.g., a plurality of auxiliary source line (SL) planes of the plurality of sub-arrays of memory cells 12). In another exemplary embodiment, the semiconductor memory device 1000 may include a comprehensive source line (SL) plane coupled to the source lines (SL) 30 (e.g., $30_i$, $30_{i+1}$, $30_{i+2}$, and $30_{i+3}$) associated with each of the plurality of sub-arrays of memory cells 12. The comprehensive source line (SL) plane of the semiconductor memory device 1000 may be coupled to a constant power source 1002. The constant power source 1002 may be an internal voltage source and/or a charge pump located within the memory cell selection and control circuitry 38. Also, the constant power source 1002 may be an external voltage source and/or a charge pump coupled to the semiconductor memory device 1000.

Figure 11:
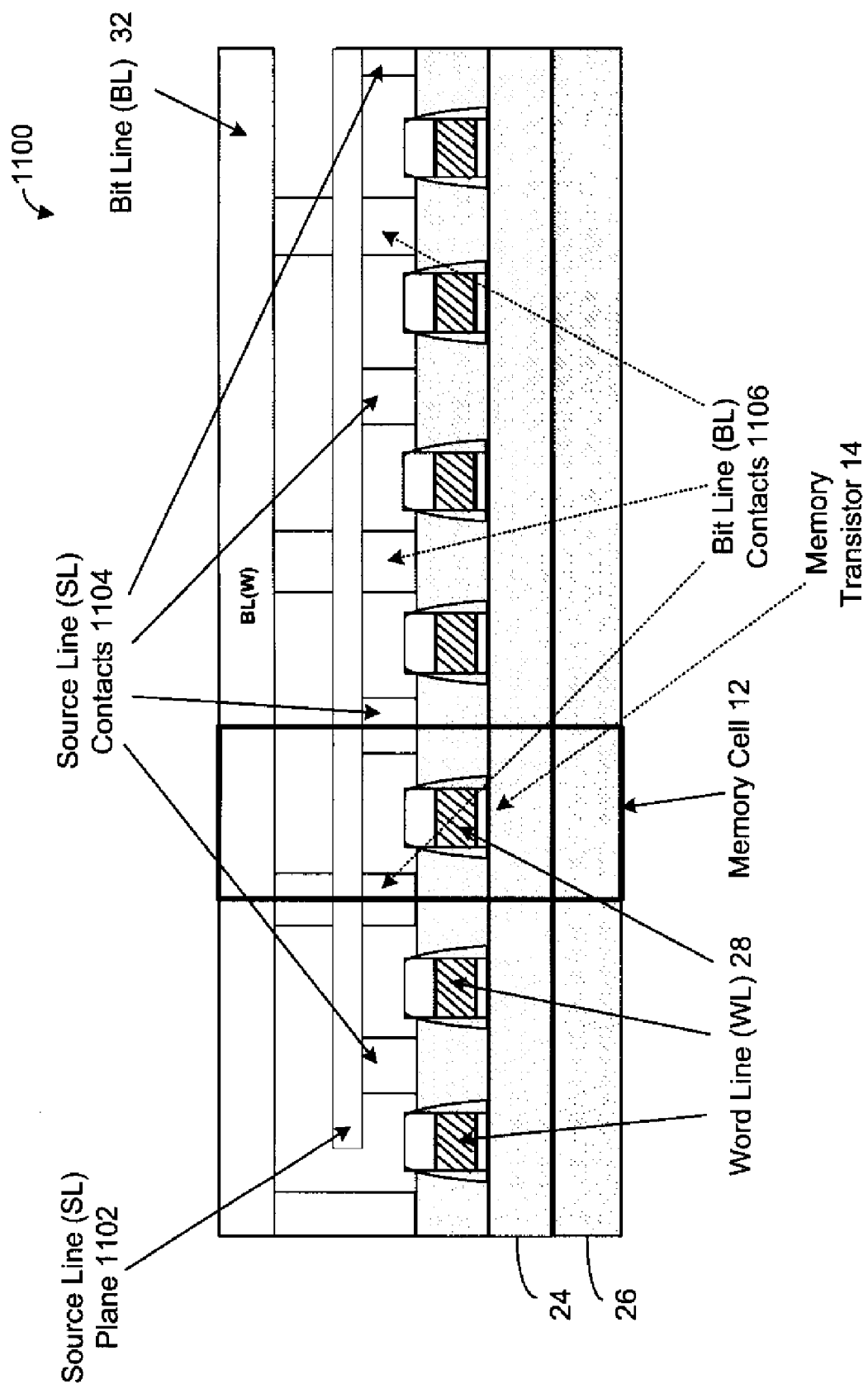
FIG. 11 shows a sectional view of a plurality of memory cells of a semiconductor memory device in accordance with an embodiment of the present disclosure.

FIG. 11 shows a sectional view of a plurality of memory cells 12 of a semiconductor memory device 1100 in accordance with an embodiment of the present disclosure. Each of the plurality of memory cells 12 of the semiconductor memory device 1100 may include a memory transistor 14 having an electrically floating body (e.g., an N-channel type transistor or a P-channel type transistor). The memory transistor 14 may be disposed on or above a region 24, which may be an insulation region (e.g., in an SOI material/substrate) or non-conductive region (e.g., in a bulk-type material/substrate). The insulation or non-conductive region 24 may be disposed on a substrate 26.

Data may be written into and/or read from a selected memory cell 12 by applying suitable control signals to a selected word line (WL) 28, a selected source line (SL) 30, and/or a selected bit line (BL) 32. As illustrated in FIG. 11, a source line (SL) 30 may include a source line plane 1102 coupled to a plurality of source line (SL) contacts 1104 which are in turn coupled to a plurality of memory cells 12. Also, the plurality of source line (SL) contacts 1104 may be coupled to a constant power source via the source line (SL) plane 1102. The source line (SL) plane 1102 may be made of a conductive metal such as, for example, tungsten, copper, aluminum, an earth-alkaline metal, and/or an alloy thereof. Also, the source line (SL) plane 1102 may be made of an active material such as, for example, poly-silicon, borophosphosilicate glass (BPSG), amorphous silicon, and/or other similar materials. A bit line (BL) 32 may include a plurality bit line (BL) contacts 1106 coupled to a plurality of memory cells 12. Also, a word line (WL) 28 may be coupled to each of a plurality of memory cells 12.

In an exemplary embodiment, the source line (SL) plane 1102 may be a comprehensive source line (SL) plane (e.g., a single metal plate) coupling source lines (SL) of the plurality of memory cells 12 of the semiconductor memory device 1100. For example, the comprehensive source line (SL) plane may comprise a plurality layers of a sub-source line (SL) plane. The comprehensive source line (SL) plane may be made from a solid piece of material and/or a grid comprised of vertical and/or horizontal source lines (SL). Also, the source line (SL) plane 1102 may be an auxiliary source line (SL) plane coupling source lines (SL) of a sub-array of memory cells 12 of the semiconductor memory device 1100. It may be appreciated by one skilled in the art that the size (e.g., number of rows and columns) of the sub-array of memory cells 12 having the source line (SL) plane 1102 may vary. For example, the sub-array of memory cells 12 may include, but is not limited to, eight rows by eight columns, sixteen rows by sixteen columns, thirty-two rows by thirty-two columns, sixty-four rows by sixty-four columns, etc.

At this point it should be noted that providing a source line (SL) plane in accordance with the present disclosure as described above may involve the processing of input data and the generation of output data to some extent. This input data processing and output data generation may be implemented in hardware or software. For example, specific electronic components may be employed in a design circuit or similar or related circuitry for implementing the functions associated with providing a source line (SL) plane in accordance with the present disclosure as described above. Alternatively, one or more processors operating in accordance with instructions may implement the functions associated with providing a source lines (SL) plane in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for providing a source line plane comprising:
   a source line plane coupled to at least one constant voltage source, wherein the source line plane is at least one of a source line grid and a single plate; and
   a plurality of memory cells arranged in an array of rows and columns, each memory cell including one or more memory transistors comprising:
   a first region coupled to the source line plane;
   a second region coupled to a bit line;
   a body region disposed between the first region and the second region, wherein the body region is electrically floating; and
   a gate coupled to a word line and spaced apart from, and capacitively coupled to, the body region.

2. The apparatus according to claim 1, wherein the at least one constant voltage source provides at least one connection to ground.

3. The apparatus according to claim 2, wherein the at least one constant voltage source provides at least one internal ground connection associated with the plurality of memory cells.

4. The apparatus according to claim 2, wherein the at least one constant voltage source provides at least one external ground connection coupled to the plurality of memory cells.

5. The apparatus according to claim 1, wherein the at least one constant voltage source provides a connection to at least one voltage potential.

6. The apparatus according to claim 5, wherein the at least one constant voltage source provides at least one internal voltage potential associated with the plurality of memory cells.

7. The apparatus according to claim 5, wherein the at least one constant voltage source provides at least one external voltage potential coupled to the plurality of memory cells.

8. The apparatus according to claim 1, wherein the source line plane comprises a plurality of source lines coupled to the plurality of memory cells.

9. The apparatus according to claim 1, wherein the first region is coupled to the source line plane via a source line.

10. The apparatus according to claim 1, wherein the plurality of memory cells are arranged in a plurality of sub-arrays of rows and columns.

11. The apparatus according to claim 10, wherein the source line plane is associated with each of the plurality of sub-arrays of memory cells.

12. The apparatus according to claim 11, wherein the source line plane is a comprehensive source line plane based at least in part on its association with the each of the plurality of sub-arrays of memory cells.

13. The apparatus according to claim 12, wherein the comprehensive source line plane is coupled to the at least one constant voltage source.

14. The apparatus according to claim 1, wherein the source line plane includes a plurality of sub-layers of at least one of a source line grid and a single plate.

15. A method for providing a source line plane comprising the steps of:

coupling a source line plane to at least one constant voltage source, wherein the source line plane is at least one of a source line grid and a single plate; and arranging a plurality of memory cells in an array of rows and columns, each memory cell including one or more memory transistors comprising:
- a first region coupled to the source line plane;
- a second region coupled to a bit line;
- a body region disposed between the first region and the second region, wherein the body region is electrically floating; and
- a gate coupled to a word line and spaced apart from, and capacitively coupled to, the body region.

16. The method according to claim 15, wherein the at least one constant voltage source provides at least one connection to ground.

17. The method according to claim 15, wherein the at least one constant voltage source provides a connection to at least one voltage potential.

18. The method according to claim 15, wherein the source line plane comprises a plurality of source lines coupled to the plurality of memory cells.

19. The method according to claim 15, wherein the first region is coupled to the source line plane via a source line.

20. The method according to claim 15, wherein the at least one constant voltage source is at least one internal voltage source associated with the plurality of memory cells.

21. The method according to claim 15, wherein the at least one constant voltage source is at least one external voltage source coupled to the plurality of memory cells.

22. The method according to claim 15, wherein the plurality of memory cells are arranged in a plurality of sub-arrays of rows and columns.

23. The method according to claim 22, wherein the source line plane is associated with each of the plurality of sub-arrays of memory cells.

24. The method according to claim 23, wherein the source line plane is a comprehensive source line plane based at least in part on its association with the each of the plurality of sub-arrays of memory cells.

25. The method according to claim 24, wherein the comprehensive source line plane is coupled to the at least one constant voltage source.

* * * * *